United States Patent
Oshika et al.

(10) Patent No.: US 8,516,692 B2
(45) Date of Patent: Aug. 27, 2013

(54) SOLDER LAYER, SUBSTRATE FOR DEVICE JOINING UTILIZING THE SAME AND METHOD OF MANUFACTURING THE SUBSTRATE

(75) Inventors: Yoshikazu Oshika, Chiyoda-ku (JP); Munenori Hashimoto, Chiyoda-ku (JP); Masayuki Nakano, Chiyoda-ku (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 655 days.

(21) Appl. No.: 12/297,438

(22) PCT Filed: Mar. 28, 2007

(86) PCT No.: PCT/JP2007/056740
§ 371 (c)(1),
(2), (4) Date: Oct. 16, 2008

(87) PCT Pub. No.: WO2007/119571
PCT Pub. Date: Oct. 25, 2007

(65) Prior Publication Data
US 2009/0095513 A1    Apr. 16, 2009

(30) Foreign Application Priority Data

Apr. 17, 2006   (JP) ................. 2006-112940

(51) Int. Cl.
*H05K 3/34* (2006.01)
(52) U.S. Cl.
USPC ............ 29/840; 29/860; 228/179.1; 228/245; 228/203; 174/264

(58) Field of Classification Search
USPC .......................................... 257/772; 174/264
See application file for complete search history.

(56) References Cited

U.S. PATENT DOCUMENTS 3,725,144 A * 4/1973 Harvey .......................... 148/528
5,197,654 A    3/1993 Katz et al.
(Continued)

FOREIGN PATENT DOCUMENTS
EP    0 542 475 A1    5/1993
EP    0 911 111 A2    4/1999
(Continued)

OTHER PUBLICATIONS

English translation of JP2002-224882.*

(Continued)

*Primary Examiner* — Tuan T Dinh
*Assistant Examiner* — Steven Sawyer
(74) *Attorney, Agent, or Firm* — Chen Yoshimura LLP

(57) ABSTRACT

A solder layer, a substrate for device joining utilizing the same and a method of manufacturing the substrate are provided whereby the device joined remains thermally unaffected, an initial bonding strength in solder joint is enhanced and the device can be soldered reliably. The solder layer formed on a base substrate (2) consists of a plurality of layers (5a) of a solder free from lead, which are different in its phase from one another. They are constituted by a layer of a phase that is completely melted, and a layer of a phase that is not completely melted at a temperature not less than a eutectic temperature of the solder. The solder layer (5) can be applied to a device joining substrate (1) comprising an electrode layer (4) formed on the base substrate (2) and the solder layer (5) formed on the electrode layer.

2 Claims, 29 Drawing Sheets

(56) References Cited

U.S. PATENT DOCUMENTS

| | | | |
|---|---|---|---|
| 5,421,507 A * | 6/1995 | Davis et al. | 228/194 |
| 5,854,087 A | 12/1998 | Kurata | |
| 5,990,560 A * | 11/1999 | Coult et al. | 257/772 |
| 6,124,635 A | 9/2000 | Kuwabara | |
| 6,383,923 B1 * | 5/2002 | Brown et al. | 438/666 |
| 6,927,492 B2 * | 8/2005 | Dautartas | 257/738 |
| 7,009,299 B2 * | 3/2006 | Angst et al. | 257/772 |
| 2003/0134142 A1 * | 7/2003 | Ivey et al. | 428/646 |
| 2005/0127147 A1 * | 6/2005 | Kao et al. | 228/254 |
| 2005/0212140 A1 | 9/2005 | Fujinaga et al. | |
| 2007/0246829 A1 * | 10/2007 | Yamane et al. | 257/750 |
| 2009/0207580 A1 | 8/2009 | Oshika et al. | |

FOREIGN PATENT DOCUMENTS

| | | |
|---|---|---|
| EP | 1 002 612 A1 | 5/2000 |
| JP | 06-069608 A | 3/1994 |
| JP | 2762007 B2 | 3/1998 |
| JP | 10-270613 A | 10/1998 |
| JP | 3156798 B2 | 2/2001 |
| JP | 2002-224882 A | 8/2002 |
| JP | 2004-111607 A | 4/2004 |
| JP | 2005-285882 A | 10/2005 |
| WO | 2004/042819 A1 | 5/2004 |
| WO | 2006/098454 A1 | 9/2006 |

OTHER PUBLICATIONS

English translation of JP H10-270613.*
European Search Report dated Dec. 10, 2010, in a counterpart European patent application No. 07740178.4 for Examiner consideration.
Simic et al, "This film interdiffusion of Au and Sn at room temperature", Journal of the Less-Common Metals, 51, pp. 177-179, 1977. Mentioned on p. 3 of the as-filed translation of the specification as concise explanation of relevance.
Kuang et al, "Effect of Temperature Cycling on Joint Strength of PbSn and AuSn Solders in Laser Packages", IEEE Transaction on Advanced Packaging, vol. 24, No. 4, pp. 563-568, Nov. 2001. Mentioned on p. 3 of the as-filed translation of the specification as concise explanation of relevance.
"Metal Data Book" compiled by the Japan Institute of Metals, revised 3rd Edition, Maruzen, p. 490, Mar. 25, 1993. Mentioned on p. 3 of the as-filed translation of the specification as concise explanation of relevance.
International Search Report (ISR) for PCT/JP2007/056740.
PCT/ISA/237 in PCT/JP2007/056740 and its English translation of Section V.
Translation of PCT/ISA/237, IB338, and IB373 of PCT/JP2007/056740.
Applicants bring the attention of the Examiner to the following pending U.S. Appl. No. 12/037,958, filed Feb. 27, 2008.
Yamaguchi et al., "Study on Au/Sn micro soldering method applied for fine pitch multilayer lead frame used for quad flat LSI package", Abstracts of National Meeting of Japan Welding Society, vol. 49, pp. 410-411, Sep. 1991. Mentioned on p. 2 of the as-filed specification of the related U.S. Appl. No. 12/037,958.
Kubaschewski et al., "Materials Thermochemistry", 6th Edition, Pergamon Press, pp. 258-261, 274-275, and 308-311 (Table I), 1993. Mentioned on p. 2 of the as-filed specification of the related U.S. Appl. No. 12/037,958.
Kubaschewski et al., "Metallurgical Thermochemistry", 5th Edition, Pergamon Press, pp. 268-271, 282-283, and 310-313 (Table A), 1979. Mentioned on p. 2 of the as-filed specification of the related U.S. Appl. No. 12/037,958.
Ishii et al., "Fluxless Fabrications of Sn-Au Solder Microbumps by a Hydrogen Plasma Reflow Technique", Journal of Electronic Materials, vol. 34, No. 5, 2005, pp. 630-634. Referenced by a US Examiner in PTO-892 form for the related U.S. Appl. No. 12/037,958.
Japanese Office Action dated on Jun. 21, 2011, in a counterpart Japanese patent application No. 2007-048170 of the related U.S. Appl. No. 12/037,958. Concise explanation of relevance: the Japanese Office Action rejects claims in the Japanese application in view of Foreign Patent document Nos. 1-2 above.

* cited by examiner (A) (B) (C)

(A)

(B)

Ex. 5   Comp. Ex. 4   Comp. Ex. 5   Comp. Ex. 6

SOLDER LAYER, SUBSTRATE FOR DEVICE JOINING UTILIZING THE SAME AND METHOD OF MANUFACTURING THE SUBSTRATE

TECHNICAL FIELD

The present invention relates to a solder layer for use in an electronic circuit board, to a substrate for device joining utilizing the solder layer and to a method of manufacturing the substrate.

BACKGROUND ART

Electronic parts of various kinds are usually mounted at selected positions on copper wiring patterns formed on a printed circuit board and are soldered to form electronic circuit wirings. In a conventional electronic circuit, a solder layer containing Pb (lead) as a main component has been used to join an electronic device on a printed circuit board of paper phenol resin, epoxy resin, glass epoxy resin, or the like.

Patent Reference 1 discloses a semiconductor mounting circuit board in which an insulating filler is applied on a metal base substrate to be patterned thereon with aluminum (Al), copper (Cu) or the like forming a circuit to achieve high-density implementing of semiconductors on the circuit board. In the board described in this Reference, silica containing epoxy resin of 100 µm thickness is used as the insulating filler on which a foil of aluminum and copper is formed as a wiring layer.

Patent Reference 2 discloses a metal thin film laminate ceramic board in which conductive layers of such as Cu are applied on a ceramic substrate of AlN. Of this metal thin film laminate ceramic board, the conductive layers are patterned to form a circuit used in an IC package.

However, solders containing lead and tin (Sn) tend to be restricted from use in recent years for reducing environmental load. Especially in Europe, their usages have been banned by the RoHS Directive (directive of the European Assembly and Directorate on restriction of the use of certain hazardous substances in electrical and electronic equipments) since Jul. 1, 2006. Consequently, lead free solders such as those formed of Au—Sn, Ag—Sn, In—Sn, Zn—Sn and Bi—Sn have been proposed as alternatives of the lead and tin containing solders.

Nonpatent Reference 1 reports that when a solder if not containing lead is left at room temperature, it takes more than 10 months for equilibrium to be reached. Nonpatent Reference 2 reports that when a load by a heat cycle is applied after solder bonding in semiconductor laser package using a solder not containing lead, the strength of the solder bonding changes gradually due to that heat cycle load.

For example, when an electrode layer made of gold (Au) is formed on a substrate as an uppermost layer and a device is bonded to a solder layer on the electrode layer using a lead free solder such as Au—Sn to form the solder layer, the solder layer by being heated melts once and is then allowed to harden by rapid cooling after the device is bonded. In this case, the solder that makes up the solder layer is apt to become non-equilibrial and to cause the solder layer to melt while bonding to the device. Their initial bonding strength, that is the strength of bonding between the solder layer solidified and the device bonded thereto, becomes unstable. FIG. 29 is a phase diagram illustrating phases by atomic percent of alloy consisting of Au and Sn (Au—Sn alloy) (see Nonpatent Reference 3).

Patent Reference 3, by the present inventors, discloses a submount that allows a solder protective layer disposed on the surface of a solder to be melted readily at a reduced bonding temperature by improving solubility of the solder and reducing its complete dissolution temperature, thereby to permit forming a solder joint having low thermal stress.

References Cited:
Patent Reference 1: Japanese Patent, JP 3156798 B;
Patent Reference 2: Japanese Patent, JP 2762007 B;
Patent Reference 3: Japanese Patent Laid Open Application, JP 2006-288463 A;
Nonpatent Reference 1: V. SIMIC and Z. MARINKOVIC, "Thin film interdiffusion of Au and Sn at room temperature", J. Less-Common Metals, 51, pp. 177-179, 1977;
Nonpatent Reference 2: J-H. Kuang and five others, "Effect of Temperature Cycling on Joint Strength of PbSn and AuSn Solders in Laser Packages", IEEE Trans., Adv. Pack, Vol. 24, No. 4, pp. 563-568, 2001; and
Nonpatent Reference 3: (Japanese) "Metal Data Book" compiled by the Japan Institute of Metals, revised 3rd Edition, MARUZEN, p. 410, Mar. 25, 1993.

DISCLOSURE OF THE INVENTION

Problems To Be Solved By The Invention

In the use of a conventional lead containing solder, there has arisen no problem in an initial bonding strength between a device and the solder. Now that the lead containing solder is being restricted to use. When its alternative of solder layer substantially free from lead is used, the problem arises that the solder layer after melted and solidified becomes non-equilibrial and enough initial bonding strength enough for a device cannot be obtained.

In order to obtain a raised initial bonding strength between the solder and a device such as a semiconductor device in conventional solder joining, it is desirable to join them at a temperature more than 300° C. However, solder joining at a temperature more than 300° C. increases a heat load on the device such as a semiconductor device or electronic component and may cause a damage on the device.

On the other hand, solder joining at a temperature of 300° C. or less lowers the possibility of the damage on the device. However, the initial bonding strength of solder joint weakens and the solder joint may cause to be broken by falling or the like. Thus, it is necessary to take care of handling a board on which the device is implemented. It has become a problem how to increase the bonding strength of a solder joint in a short period of time. Also, with the recent trend of increasing the output power and reducing the size of devices, it becomes essential how effectively to dissipate the heat generated from the device for raising its quality and reliability. Currently, the heat generated from a device is dissipated by disposing a joint substrate between a device and a package. Such a joint substrate is called a submount that is made up of a solder layer and a substrate having a high thermal conductivity. However, there is the problem that the device quality is not raised as expected by using a conventional solder layer due to the increased electric and thermal resistances by contact resistance between the solder layer and the device.

In view of the problems mentioned above, it is an object of the present invention to provide a solder layer, a substrate for device joining utilizing the solder layer and a method of manufacturing the substrate whereby a device joined remains thermally unaffected, an initial bonding strength in solder joint is enhanced and the device can be soldered reliably and further the thermal resistance is held small, thereby to permit raising the performances and reliability of the device.

MEANS FOR SOLVING THE PROBLEMS

In order to achieve the object mentioned above, there is provided in accordance with the present invention a lead free solder layer formed on a base substrate, characterized in that the solder layer consists of a plurality of layers of a solder which are different in its phase from one another. The solder layer preferably has a thickness of not more than 10 μm. A device joining substrate preferably has a thermal resistance of not more than 0.35 K/W.

According to the structure mentioned above, the solder layer can be melted uniformly over its surfaces and can be held in an equilibrium state after it is melted and then solidified whereby an initial strength of joint between a device and the solder layer can be stably maintained. Also, the solder layer that has a high initial strength of joint with a device can be obtained. Further, the low thermal resistance allows improving characteristics and reliability of the device joined by soldering. Therefore, the solder can be sufficiently used not only in small modules for conventional cellular phones and other consumer apparatus but also in applications high in thermal load, for example, the field of automotive and power device applications.

A device joining substrate of the present invention has a base substrate and a lead free solder layer formed on the base substrate, and is characterized in that the solder layer consists of a plurality of layers of a solder which are different in its phase from one another. The solder layer preferably has a thickness of not more than 10 μm.

According to the structure mentioned above, the device joining substrate that has a high initial strength of joint between the solder layer and the device can be provided.

The present invention also provides a method of manufacturing a device joining substrate having a lead free solder layer formed on a base substrate, characterized in that the method comprises the steps of forming the solder layer on the base substrate and thereafter heat-treating the solder layer formed on the base substrate. The solder layer formed on the base substrate is heat-treated at a temperature higher than 150° C. but lower than an eutectic temperature thereof. Preferably, the solder layer by the step of heat treatment is split into a layer of a phase that starts melting, and a layer of a phase that remains unmolten at the eutectic temperature.

According to the method of the present invention, it is possible to form a plurality of layers split within a solder layer, to hold the solder layer in an equilibrium state and to manufacture a device joining substrate which has a high initial strength of joining between a device and the solder layer and which has a small thermal resistance.

EFFECTS OF THE INVENTION

According to the present invention, a lead-free solder layer which has a high initial strength of joining with a device as well as a device joining substrate utilizing the solder layer and a method of manufacturing the same can be provided.

Figure 1:
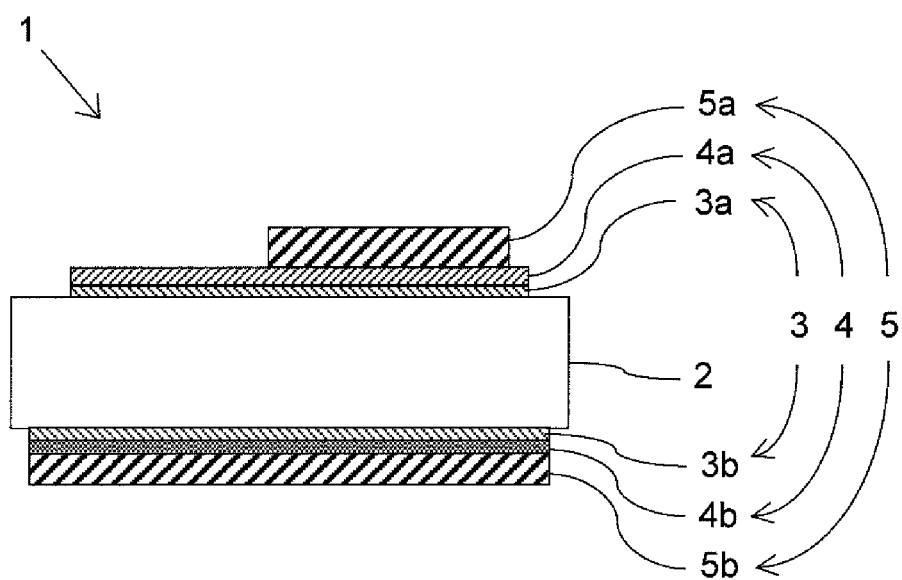
FIG. 1 is a cross sectional view diagrammatically illustrating the structure of a device joining substrate as a first form of implementation of the present invention.

DESCRIPTION OF REFERENCE NUMERALS 1, 1a, 10, 10a: Device joining substrate (Submount)
2: Base substrate
3: Adherent layer
3a: Front side adherent layer
3b: Rear side adherent layer
4, 13: Electrode layer
4a: Front side electrode layer
4b: Rear side electrode layer
5, 14: Solder layer
5a: Front side solder layer
5b: Rear side solder layer
5c: Solder layer ($Au_5Sn$) on the device joining face side of solder layer
5d: Solder layer (AuSn) on the substrate joining face side of solder layer
5e: Liquid phase
5f: Phase of high melting start temperature
7, 15: Semiconductor device
11: Metal base substrate
12: Ceramic layer (ceramic thin film)
15a: Upper electrode of semiconductor device
15b: Lower electrode of semiconductor device
16: Au wire
22: Stem
24: Low temperature solder (conductive paste)

Best Modes For Carrying Out The Invention

An explanation is given hereinafter of forms of implementation of the present invention with reference to the Drawing Figures in which identical reference characters are used to designate identical or corresponding components.

FIG. 1 is a cross sectional view diagrammatically illustrating the structure of a device joining substrate of the present invention. As shown in FIG. 1, the device joining substrate 1 comprises an electrode layer 4 formed via an adherent layer 3 on a base substrate 2 and a solder layer 5 formed on an electrode layer 4. In the first form of implementation, the adherent layer 3, the electrode layer 4 and the solder layer 5 are formed on each of the front and rear faces of the base substrate 2. To with, front and rear sides across the base substrate 2 are formed via adherent layer 3a and 3b with front side and rear side electrode layers 4a and 4b, respectively. The front side solder layer 6a and the rear side solder layer 5b are formed on each electrode layers at their selected portions, respectively. Here, the electrode layer 4 may be formed over a whole surface of the base substrate 2 or may be formed as a patterned electrode. Also, an electric circuit may be formed by connecting a gold wire to a portion of the electrode layer 4. Note that the adherent layer 3, the electrode layer 4 and the solder layer 5 may be formed on one side only. The adherent layer 3 is used to improve the degree of adhesion between the solder and electrode layers 5 and 4. When their degree of adhesion is good, they may be laminated directly, e.g., by pasting, without insertion of the adherent layer 3.

The base substrate 2 used may be a semiconductor single crystal substrate such as of Si or diamond II a or a ceramic substrate such as of aluminum nitride (AlN) or silicon carbide (SiC) which has a high thermal conductivity. The base substrate 2 may have an electrode layer identical to the above formed on a side face thereof, too, and may then have its upper and lower faces electrically connected together. This base substrate 2 may be a submount small enough in area on which a light emitting device such as light emitting diode may be mounted.

Figure 2:
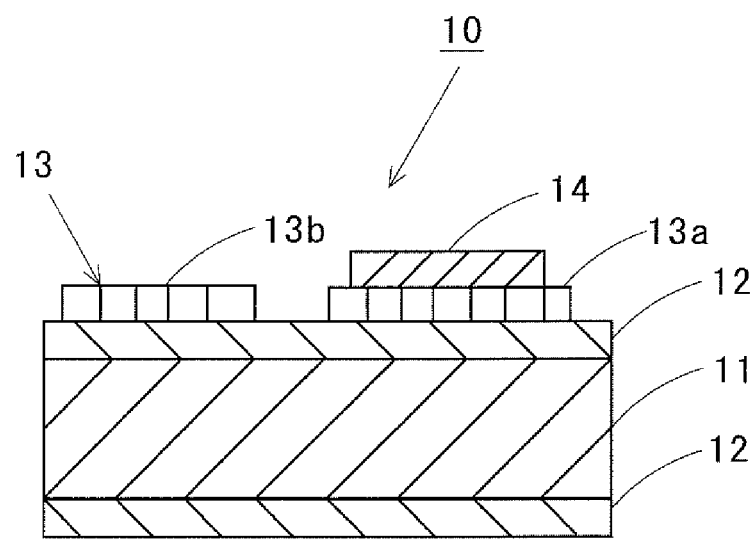
FIG. 2 is a cross sectional view diagrammatically illustrating the structure of a device joining substrate representing a second form of implementation of the present invention.
Figure 3:
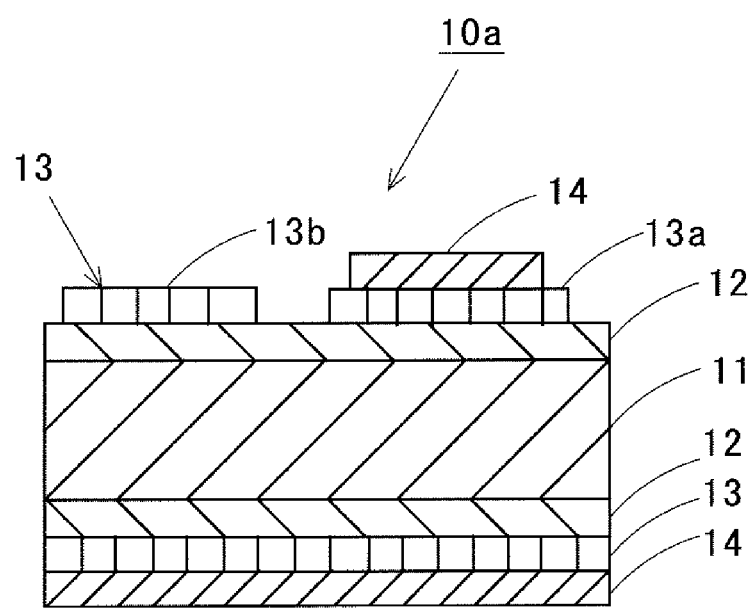
FIG. 3 is a cross sectional view diagrammatically illustrating the structure of a device joining substrate representing a third form of implementation of the present invention.

FIGS. 2 and 3 are cross sectional views diagrammatically illustrating the structures of device joining substrates representing a second and a third form of implementation of the present invention. As shown in FIG. 2, a device joining substrate 10 is constructed as a metal-ceramic composite substrate. The device joining substrate 10 comprises a metal base substrate 11, ceramic layers 12 and 12 formed across the metal base substrate 11 on its front and rear faces so as to cover a whole of the metal base substrate 11, an electrode layer 13 formed on a surface of the ceramic layer 12 so as to cover a part or whole thereof and a solder layer 14 formed at a selected place 13a on a surface of the electrode layer 13.

Here, in the case of a light emitting diode, the place on which the electrode layer 13 is formed may be a whole of the electrode layer 13. Also, there may remain an electrode layer 13b that is formed with no solder layer. That electrode layer 13b may be patterned, and may have a gold wire connected to a portion thereof to form an electric circuit.

The metal base substrate 11 may be provided on its rear face with an electrode layer 13 and/or a solder layer 14. FIG. 3 shows a metal ceramic composite substrate 10a as an example. In the metal ceramic composite substrate 10, a ceramic layer 12, an electrode layer 13 and a solder layer 14 are deposited in order on rear side face of the metal base substrate 11. There may be interposed an adherent layer (not shown) between the metal base substrate 11 and the ceramic layer 12 and/or between the electrode layer 13 and the solder layer 14 to improve their adhesion when they are formed. The adhesive layer is suitably of titanium.

As the metal base substrate 11, a metal base substrate composed of copper, aluminum or the like may be used for effectively dissipating heat generated from a device. Such a metal base substrate preferably has a heat conductivity of, e.g., 230 W/mK or more.

As the ceramic layer 12, a ceramic thin film good in adhesion to the metal substrate 11, preferably a nitride ceramic thin film such as aluminum nitride that has a low thermal resistance may be used.

While the device joining substrate is mentioned of the three exemplary ones 1, 10 and 10a, it should not be limited to these illustrations. It may be a substrate in any structure that comprises an electrode layer 4, 13 and a solder layer 5, 14 formed thereon. It may be a substrate in any structure on which a device can well be mounted on-board by bonding with the solder layer 5, 14.

The electrode layer 4, 13 may be made of a metal. It is preferably of any of metals, in particular of gold (Au), platinum (Pt), silver (Ag), copper (Cu), iron (Fe), aluminum (Al), titanium (Ti) and tungsten (W), or an alloy containing any of these metals.

The adherent layer 3 may be preferably made of a metal that is good in adherence to the base substrate 2 and has high melting point, being hard to cause interdiffusion with the solder layer 5. The adherent layer 3 used may be made of a metallic material whose main component is any one of such as Ti (titanium), Cr (chromium), Ni (nickel) and Mo (molybdenum), or an alloy of any one of Ti, Ni, Cr and Mo.

A solder material substantially free from lead (Pb) can be preferably used for the solder layer 5, 14. The solder layer 5, 14 free from lead in the present invention means a solder of which lead is not an intentional component. Lead contained in a lead free solder layer as a residual component unavoidably included in its refining process may be included within a limit not adversely affecting the environment or the like. The solder layer 5, 14 may be preferably made of materials containing two or more elements of silver, gold, copper, zinc (Zn), nickel (Ni), indium (In), gallium (Ga), bismuth (Bi), aluminum and tin (Sn).

Figure 4:
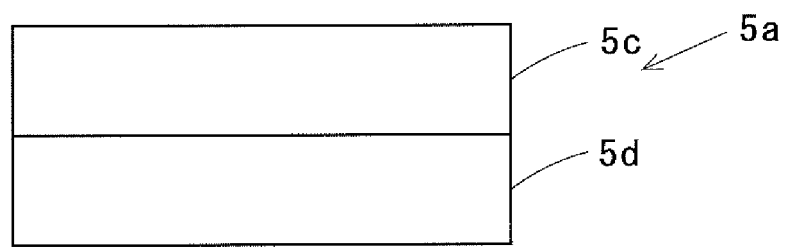
FIG. 4 is a diagrammatic view of an enlarged solder layer of the present invention.

FIG. 4 is a diagrammatic view of an enlarged a solder layer 6a on its front side of the present invention. As shown in FIG. 4, a lead free solder layer 6a is formed of a plurality of sub-layers 5c, 5d. The upper portion is the layer 5c for the device joining face side and the lower portion is the layer 5d for the substrate joining face side. These layers 5c, 5d are different in phase from one another. When the solder layer 6a in whole has a composition of Au:Sn=70:30 (weight percentage), the solder layer 5c is of $Au_5Sn$ as a phase melting at a relatively low temperature and the solder layer 5d is of AuSn as a phase melting at a relatively high temperature. When this solder layer 6a is raised in temperature, preferably to 278° C. or more, the $Au_5Sn$ as the sub-layer 5c on its device joining face side will melt first. That is to say, the device joining face side of the solder layer 6a will come to be constituted by a sub-layer that can be melted at a relatively low temperature, thus making its wettability uniform as a whole.

When the material of lead free solder layer 6a used is an Au—Sn alloy, the solder layer 6a can be of a composition outside of its eutectic composition, e.g., Au:Sn (weight percentage)=70:30. If the solder layer 6a is an alloy of Ag and Sn (Ag—Sn alloy), e.g., having a composition Ag:Sn (weight percentage)=90:10, it is possible and desirable to increase a difference between the temperatures at which the respective phases start melting individually (the temperature, hereinafter, referred to as "melting start temperature"). As will be mentioned later, by heat-treating the lead free solder layer 6a after it is deposited, it is possible to divide the solder layer 6a into a plurality of layers 5c, 5d which are different in phase of solder from one another. For example, after the solder layer 5a composed of an Au—Sn alloy is formed, it can be heat-treated to divide into two layers 5c and 5d different in melting start temperature. The layer 5c lying on the front side of the solder layer will be changed to $Au_5Sn$ phase, while the layer 5d lying adjacent to the base substrate 2 will be changed to Au—Sn phase.

Next, the mounting a semiconductor device onto a device joining substrate 1, 10 as mentioned above will be described.

Figure 5:
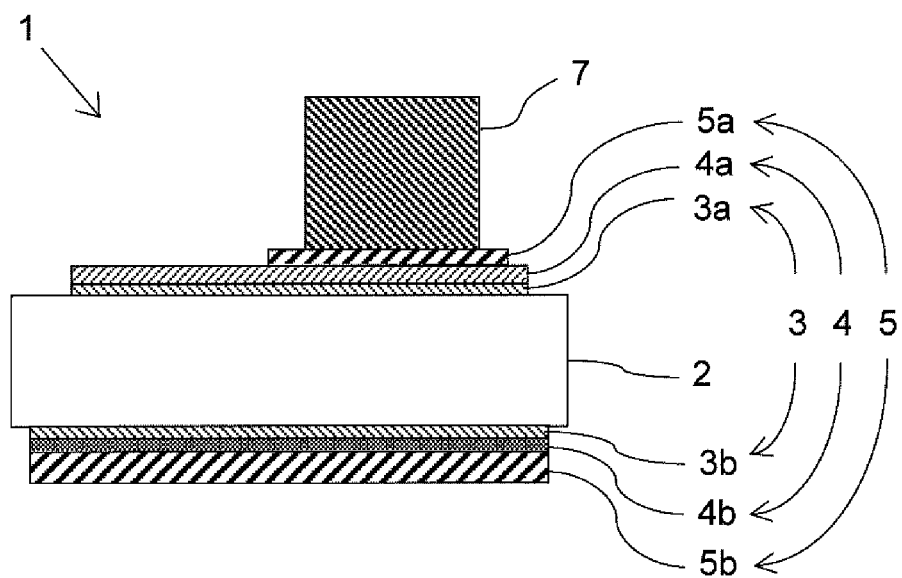
FIG. 5 is a cross sectional view diagrammatically illustrating a structure that a semiconductor device is mounted on the device joining substrate shown in FIG. 1.

FIG. 5 is a cross sectional view diagrammatically illustrating a structure that a semiconductor device 7 is mounted on the device joining substrate 1 shown in FIG. 1. As shown in FIG. 5, a semiconductor device 7 can be soldered and thereby bonded to the device joining substrate 1 with the solder layer 6a on its front side.

Figure 6:
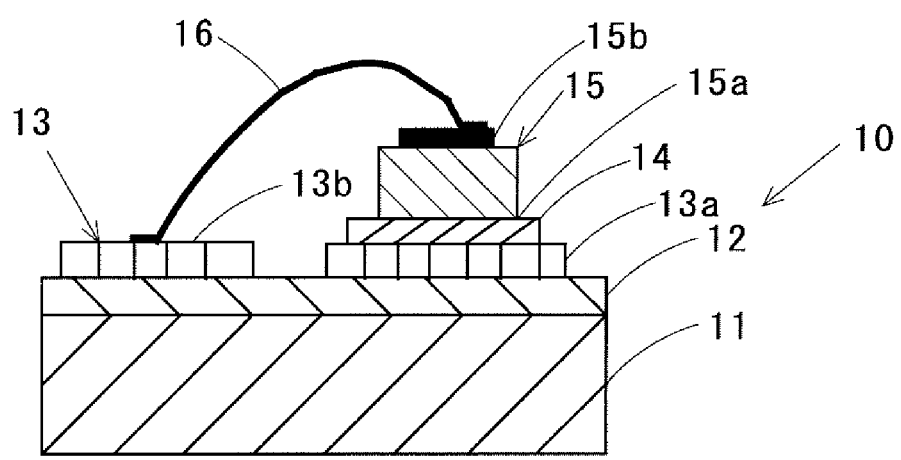
FIG. 6 is a cross sectional view diagrammatically illustrating a structure that a semiconductor device is mounted on the device joining substrate shown in FIG. 3.

FIG. 6 is a cross sectional view diagrammatically illustrating a structure that a semiconductor device is mounted on the device joining substrate 10 shown in FIG. 3. As shown in FIG. 6, the lower electrode 16a of a semiconductor device 15 can be soldered and thereby bonded to the device joining substrate 10 with the solder layer 14 on its front side. Also, when a general-purpose solder 14 composed of an Au—Sn alloy is used, the semiconductor device 15 can be soldered and joined without any flux.

On the other hand, the electrode layer 13b at the left hand side that has no solder layer is insulated from the electrode layer 13a at the right hand side. Then, the upper electrode 1b of the semiconductor device 15 can be connected to the electrode layer 13b by wire bonding. The Au etc. wire may be used.

Here, the semiconductor device 7, 15 may be a light emitting device such as a laser diode or a light emitting diode, or an active device such as a transistor or a thyristor for use in high frequency amplification or switching. There is a case that the p-n junction side of the operating layer in the semiconductor device may be positioned to the surface of the heat sink. In this case, when the solder layer 5, 14 has a thickness of 10 μm or less, the short-circuiting failure between the solder layer 5, 14 and the operating layer of the active device can be prevented effectively.

FIGS. 5 and 6 show the mounted devices are semiconductor devices 7, 15. This device may be any electronic device including a passive device, a switch or an active device of every kind, and plurality of devices may be joined with the substrate by means of a solder layer 5, 14.

Figure 7:
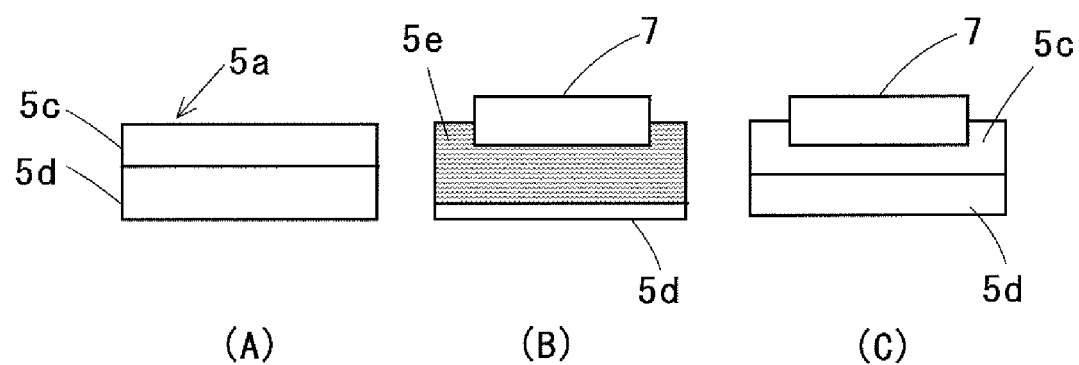
FIG. 7 includes diagrammatic views of enlarged cross section of each steps in joining a device by means of a solder layer in accordance with the present invention, illustrating their states: (A) before the solder layer is melted, (B) when the solder layer is melted and being joined with the device and (C) after the solder layer is solidified.

FIG. 7 includes diagrammatic views of enlarged cross section, of each steps in joining a device 7 by means of a solder layer 5a according to the first form of implementation shown in FIG. 1, illustrating their states: (A) before the solder layer 5a is melted, (B) when the solder layer 5a is melted and being joined with the device 7 and (C) after the solder layer 5a is solidified. As shown in FIG. 7(A), before the solder layer 5a of the present invention is melted, it has been split into two phase layers 5c and 5d. These layers are in an equilibrium state. The melting start temperature of layers 5c and 5d are different from each other. FIG. 7(B) shows the state that the solder layer 5a of FIG. 7(A) is heated to a soldering temperature. Namely, the state that the solder layer 5a is melted is designated as liquid phase 5e. In this case, the upper layer 5c of solder layer to the device joining face side is of $Au_5Sn$ phase that has relatively low melting start temperature. The lower layer 5d of solder layer is of AuSn phase that has relatively high melting start temperature. Thus, the $Au_5Sn$ phase 5c of the device joining face side will first come into a molten state. To with, since the solder layer 5a of the present invention has $Au_5Sn$ phase in the upper layer 5c split therefrom which has relatively low melting point, it is possible to evenly melt its device joining face side. Since the uniform wettability over the solder layer 5a is thus ensured, an entire joining portion of the device 7 can be joined via the solder layer 5a with the base substrate 2. Further, only the upper $Au_5Sn$ layer 5c of solder layer 5a is melted for joining. Thus, after the device 7 is joined by cooling the solder layer 5a as shown in FIG. 7(C), solder layer 5a can then be maintained in the equilibrium state that it is divided into the two layers 5c and 5d, thereby to raise the initial bonding strength. By joining a device 7 using a solder layer 5a of the present invention, it is made possible to achieve an initial bonding strength of 30 MPa or more in solder joint and to obtain such an initial bonding strength stably.

A device joining substrate 1 using a solder layer 5 in accordance with the present invention can thus have a raised initial bonding strength and, moreover, have a reduced thermal resistance. When a solder such as composed of, e.g., an Au—Sn alloy or Ag—Sn alloy having a melting point of 300° C. or less is used as the material for solder layer 5 and its thickness is 10 m or less, the submount substrate 1 has a thermal resistance easily reduced to 0.35 K/W or less, preferably not greater than 0.31 K/W. If the device 7 is the light emitting device, it can have an improved emission output power. Thus, characteristics of the device 7 joined as well as its reliability can be improved.

Figure 8:
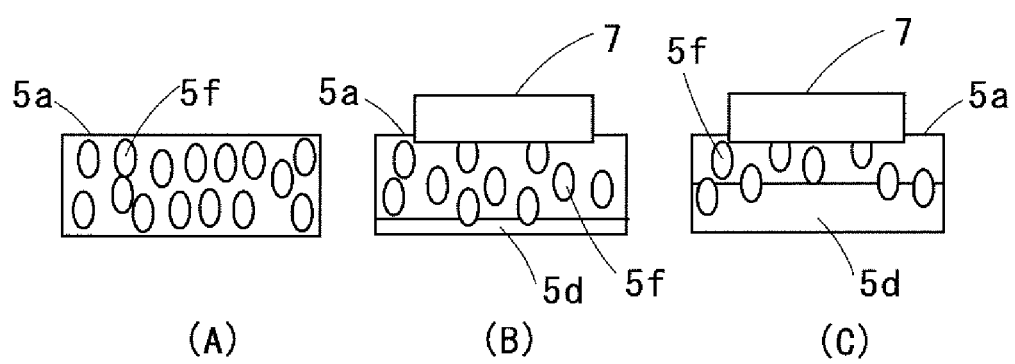
FIG. 8 includes diagrammatic views of enlarged cross section of each steps in joining a device with a solder layer when the solder layer is not heat-treated, illustrating their joining states: (A) before the solder layer is melted, (B) when the solder layer is melted and being joined with the device and (C) after the solder layer is solidified.

FIG. 8 includes diagrammatic views of enlarged cross section, of steps in joining a device with a solder layer 5a when the solder layer 5a is not heat-treated on the front side, illustrating their joining states: (A) before the solder layer 5a is melted, (B) when the solder layer 5a is melted and being joined with the device 7 and (C) after the solder layer 5a is solidified.

When the temperature is raised from the state shown in FIG. 8(A) to a bonding temperature of the solder layer 5a as shown in FIG. 8(B), the solder layer 5a is melted. Since there is the phase 5f (particulate matter as shown), in which melting start temperature to Au and Sn is high, in the vicinity of the device joining face, a part the phase 5f protrudes to a surface of the solder layer 5a. This prevents the solder layer 5a on the device joining face side from melting evenly. Consequently, since the area of contact between the device 7 and melting places of the solder layer 5a is reduced and a contact between the device 7 and the solder layer 5a is impeded locally, the satisfactory solder bonding strength can not be achieved. Here, the lower layer 5d of the solder layer in FIGS. 8(B) and (C) is Au—Sn layer.

Here, mention is made of a method of manufacturing a device joining substrate by way of an embodiment thereof.

Figure 9:
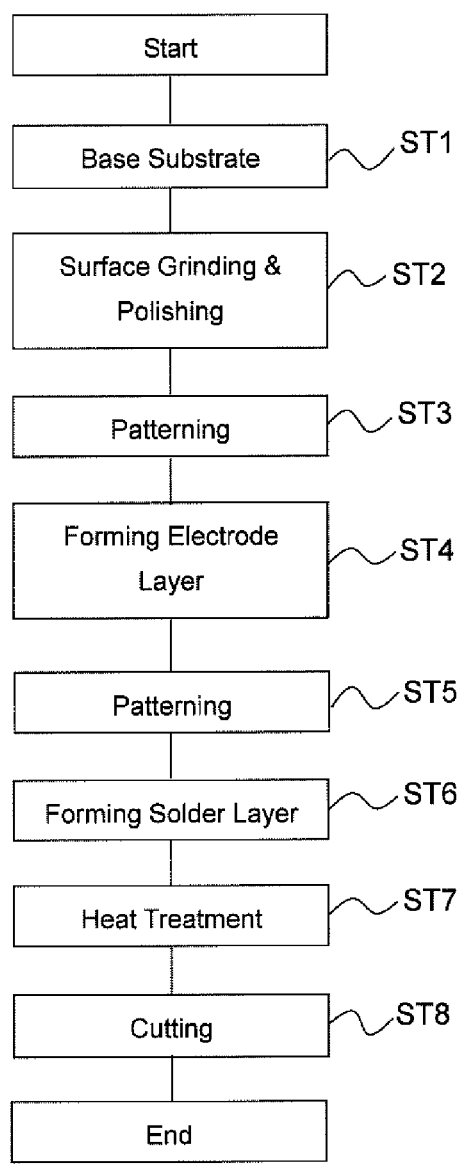
FIG. 9 is a flow chart illustrating successive steps of manufacturing the device joining substrate shown in FIG. 1.

FIG. 9 is a flow chart illustrating successive steps in a process of manufacturing the device joining substrate shown in FIG. 1.

In step ST1, a base substrate 2 composed of AlN is prepared. In step ST2, the surfaces of the base substrate 2 is ground and polished by lapping, polishing and the like processes and thereafter in step ST3, patterning is performed by photolithography or the like to expose an area on which an electrode layer 4 is to be formed.

In step ST4, the electrode layer 4 is formed on a surface of the base substrate 2 by such as vapor deposition. Then, by using liftoff process, a predetermined pattern of the electrode layer 4 is left and the other portion of the electrode layer 4 is removed. In step ST5, an area on which a solder layer 5 to be formed is patterned by using photolithography again.

Next in step ST6, the solder layer 5 is formed on the substrate using one of various vapor deposition processes and then is left only in a predetermined pattern by removing the other portions in a liftoff process.

In step ST7, the whole of a device joining substrate 1 is received in an oven or the like in which it is heat-treated at a given temperature for a selected time period. Specifically, it is preferably heat-treated at a temperature of heat treatment higher than 150° C. but lower than a eutectic temperature of the solder layer 5 for a time period of 1 hour or more.

The heat treatment is preferably processed in a designated gaseous atmosphere. The atmospheric gas used for the heat treatment can be the air, an inert gas such as nitrogen or mixture of an inert gas mixed with hydrogen or the like. After a number of device joining substrates 1 each having the solder layer 5 formed thereon are prepared in advance, it is also possible to apply the heat treatment mentioned above to them. By so doing, it is possible for solder layers 5 formed on a large number of the base substrates 2 mass-produced in advance to be heat-treated in batch processing.

By the steps mentioned above, the solder layer 5 can be split into a plurality of solid phases. In this case, the heat-treatment temperature is preferably controlled in such a manner that a furnace used for heating is held at a constant temperature.

If as the solder layer 5 a solder is used having a melting point not higher than 300° C., e.g. composed of Au—Sn alloy or Ag—Sn alloy, the heat-treatment temperature is preferably higher than, e.g., 150° C. but lower than a eutectic temperature thereof. By performing the heat treatment at such a heat treatment temperature, a bonding strength can be improved effectively. Especially, if the heat treatment temperature is 180° C. or higher, it is desirably possible to promote phase separation of a solder layer 5. But, if the heat treatment temperature is higher than its melting point, causing it to be melted, it is undesirable since the solder layer 5 cannot be phase separated.

The heat treatment can be performed stepwise at different temperatures. For example, the first temperature can be 200° C. or higher and the second can be at 250° C. The temperature can also be varied continuously from a heat treatment temperature higher than 150° C. at the first to a temperature range not exceeding the melting point of the solder layer 5. For example, after heat treatment at that heat treatment temperature, cooling once to room temperature may be followed by performing the heat treatment again. Then, at a temperature higher than 150° C. but lower than the eutectic temperature and not exceeding the melting point, the heat treatment can be carried out for a cumulative period of 1 hour or more. The heat treatment can be performed by a heater using an electric furnace or the like for exclusive heat-treatment use.

Finally, in step ST8, the device joining substrate 1 can be cut individually into pieces that may be ready as products for shipment.

When the solder layer 5 is formed by vapor deposition in the manufacturing process mentioned above, it is desirable since a device joining substrate 1 can be manufactured economically. However, the solder layer 5 formed by vapor deposition cannot be separated into layers as its deposited state. As shown in FIG. 8, the solder layer 5 becomes the layer that a particulate matters such as phase 5f that have high melting start temperatures both to Au and Sn. This solder layer 5 is split into plural layers having different melting start temperatures from one another by the heat-treatment and becomes to be equilibrium state. The upper solder layer 5c lying on the on the device joining side will be changed to the phase that has relatively low melting start temperature, while the lower solder layer 5d lying adjacent to the base substrate 2 will be changed to the phase that has relatively high melting start temperature. Thus, solder layer 5 can be separated to two layers (see FIG. 7).

In mounting a device 7 such as a semiconductor device on such a device joining substrate 1, after the lower electrode of the device 7 is mounted on the corresponding solder layer 5 of the device joining substrate 1, the solder layer 5 is heated by lamp heating or others. The solder that consists of the solder layer 5 is melted by the heating for example, in the air atmosphere of 300° C. Thus, the solder contacts with the lower electrode of the device 7, and it turns into a so-called wet state. When the heating is terminated, the solder of which the solder layer 5 is formed is lowered to the room temperature and is hardened. Thus, the solder joining is completed. In this case, since the solder forming the solder layer 5 in a state stabilized by being heat-treated as mentioned above, its initial bonding strength is stabilized when lowered to the room temperature. Thus, a reliable solder joint of the device 7 is ensured. Since the bonding strength in solder joint is sufficiently high, the occurrences of soldering failures in process of the mounting the device 7 are suppressed, this leads to the high yield of device mounting.

While in the form of implementation of the invention mentioned above, the device joining substrate 1 is shown constituted to be a single faced substrate. It should be noted that the electrode layer 4b and the solder layer 5b may be provided not only on its front side but also on its rear side of the base substrate 2. Further, if it is necessary, the adherent layer 3 may also be provided between the electrode layer 4 and the solder layer 5.

EXAMPLE 1

Hereinafter, mention is made of further details of the present invention with reference to specific examples thereof.

First, as a method of manufacturing the device joining substrate 1, an example of substrate 1 as applied to a submount will be described.

Both sides of a base substrate 2 made of AlN were washed and cleaned of their surfaces. A Ti adherent layer 3 of 0.05 μm thickness, an electrode layer 4 made of Pt in 0.2 μm thickness and Au in 0.5 μm thickness on the adherent layer 3, and a single solder layer 5 made of an Au:Sn=70:30 composition (weight percentage) in 3 μm thickness on a portion of the electrode layer 4 were formed by vacuum vapor deposition onto the surface of the base substrate 2. These layers were deposited under conditions of a degree of vacuum of $1 \times 10^{-4}$ Pa and a substrate temperature of 80° C. The base substrate 2 so processed having the solder layer 5 as above was heat-treated at 220° C., that is lower than the eutectic temperature of 278° C., for each of 0.1, 1, 5 and 10 hours, respectively. Thus, submounts 1 in Example 1 was manufactured.

Next, a tape peeling test was carried out to examine the adhesive strength of the solder layer 5 of each of submounts 1. Each of those submounts 1 in which the solder layer 5 was not peeled off in tape peeling tests was cut with a dicer into a given shape. Then, a light emitting diode 7 is soldered to join with the cut submount 1. Specifically, the submount 1 was heated by a lamp at 300° C. in the air atmosphere to join the light emitting diode 7 and the solder layer 5 together upon cooling to room temperature. Note that such peeling test here was identical technique to that commonly used to measure adhesive strength between metals. A tape having a fixed adhesive strength was used to evaluate peeling-off.

EXAMPLE 2

In Example 2, the submounts 1 each having a heat-treated solder layer 5 were prepared in the same manner as in Example 1 except that the solder layer 5 was heat-treated at a temperature of 250° C. for each of 0.1, 1, 5 and 10 hours. After the tape peeling test was performed, a light emitting diode 7 was joined at 300° C. with the solder layer 5 of the submount 1 which exhibited no peeling failure.

EXAMPLE 3

In Example 3, the submounts 1 each having a heat-treated solder layer 5 were prepared in the same manner as in Example 1 except that the solder layer 5 was heat-treated at a temperature of 180° C. for each of 0.1, 1, 5 and 10 hours. After the tape peeling test was performed, a light emitting diode 7 was joined at 300° C. with the solder layer 5 of the submount 1 which exhibited no peeling failure.

EXAMPLE 4

In Example 4, the submounts 1 each having a heat-treated solder layer 5 were prepared in the same manner as in Example 1 except that the solder layer 5 was heat-treated at a temperature of 200° C. for each of 0.1, 1, 5 and 10 hours. After the tape peeling test was performed, a light emitting diode 7 was joined at 300° C. with the solder layer 5 of the submount 1 which exhibited no peeling failure.

Comparative examples will be described.

COMPARATIVE EXAMPLE 1

Submounts of Comparative Example 1 each having a solder layer 5 were prepared in the same manner as in Example 1 except that the solder layer was not heat-treated. After the tape peeling test was performed, a light emitting diode 7 was joined at 300° C. with the solder layer of the submount which exhibited no peeling failure.

COMPARATIVE EXAMPLE 2

Submounts of Comparative Example 2 each having a solder layer 5 were prepared in the same manner as in Example 1 except that the solder layer was heat-treated at 150° C. After the tape peeling test was performed, a light emitting diode 7 was joined at 300° C. with the solder layer of the submount which exhibited no peeling failure.

COMPARATIVE EXAMPLE 3

Submounts of Comparative Example 3 each having a solder layer 5 were prepared in the same manner as in Example 1 except that the solder layer was melted by heat-treating at 280° C. After the tape peeling test was performed, a light emitting diode 7 was joined at 300° C. with the solder layer of the submount which exhibited no peeling failure.

Next, in order to examine the bonding strength between the light emitting diode 7 and the solder layer 5, a die shear test was conducted to measure the so-called chip shear strength. The die shear test is conducted to measure by using a die shear tester in conformity to the MIL Standard (MIL-STD-883C, Method 2019.4). Setting that the number N is 10 for each conditions, the chip shear strength is derived from a mean value of measurements. Specifically, a shear tool is touched to a side face of the light emitting diode 7 lying perpendicular to its solder joining surface and is moved horizontally parallel to the solder joining surface. After the shear tool is touched to the light emitting diode 7 (there defined as an origin), a maximum load (kg) that is received from the light emitting diode 7 chip and a displacement (m) of the light emitting diode 7 caused by its relative movement were measured.

From the load and displacement measured above, the bonding strength τ (Pa) and the shearing strain γ were calculated by equations (1) and (2) below.

$$\text{Bonding Strength } \tau = \text{Maximum Load (kg)} \times \text{Gravitational Acceleration (m/s}^2\text{)/Shearing Area (m}^2\text{)} \quad (1)$$

$$\text{Shearing Stress } \gamma = \text{Displacement (m)/Shearing Area Length (m) in Shearing Direction} \quad (2)$$

Here, the shearing area is the area of solder joint, namely the area of bottom surface of the light emitting diode 7 (300 μm×300 μm). The length of shearing area in shearing direction is the length of the light emitting diode 7 which is perpendicular to its chip side face, i.e., 300 μm.

Table 1 shows chip shearing strengths (MPa) of submount 1 in Examples 1 to 4 and Comparative Examples 1 to 3. Shearing strength was measured value obtained by the die shear test when the heat treatment temperature and time periods are variously varied.

TABLE 1

|  | Solder Layer Heat Treatment | Chip Shear Strength (MPa) Heat Treatment Time (Hr) | | | |
| --- | --- | --- | --- | --- | --- |
|  | Temperature (° C.) | 0.1 | 1 | 5 | 10 |
| Ex. 1 | 220 | 27.9 | 36.5 | 39.1 | 39.3 |
| Ex. 2 | 250 | 27.6 | 32.4 | 34.1 | 35.0 |
| Ex. 3 | 180 | 27.8 | 27.6 | 28.3 | 28.9 |
| Ex. 4 | 200 | 27.6 | 30.8 | 34.1 | 37.6 |
| C. Ex. 1 | None | 27.7 | | | |
| C. Ex. 2 | 150 | 27.8 | 27.5 | 27.9 | 27.9 |
| C. Ex. 3 | 280 | 27.3 | 22.7 | 15.6 | 10.5 |

As is apparent from Table 1, it has been found in submounts 1 of Example 1 that as the heat treatment time for the solder layer 5 is increased, the chip shear strength increases. Specifically, in Example 1 (where the heat treatment temperature is 220° C.), when the heat treatment time is 0.1, 1, 5 and 10 hours, the chip shear strength is 27.9 MPa, 36.5 MPa, 39.1 MPa and 39.3 MPa, respectively. Thus, the chip shear strength of 30 MPa or more was obtained with the heat treatment time of 1 hour or more. While with the heat treatment time of 0.1 hour, the solder joint strength remains the same as that in Comparative Example 1 mentioned also later in which the solder layer 5 was not heat-treated. It has turned out that a largely increased solder joint strength was obtained with the heat treatment time of 1 hour or more.

In Example 2 (where the heat treatment temperature is 250° C.), when the heat treatment time for the solder layer 5 is 0.1, 1, 5 and 10 hours, the chip shear strength for the corresponding submount 1 is 27.6 MPa, 32.4 MPa, 34.1 MPa and 35.0 MPa, respectively. Thus, the chip shear strength of 30 MPa or more was obtained with the heat treatment time of about 1 hour or more. While with the heat treatment time of 0.1 hour, the solder joint strength remains the same as that in Comparative Example 1 mentioned also later. It has turned out that a largely increased solder joint strength was obtained with the heat treatment time of 1 hour or more.

In Example 3 (where the heat treatment temperature is 180° C.), when the heat treatment time for the solder layer 5 is 0.1, 1, 5 and 10 hours, the chip shear strength for the corresponding submount 1 is 27.8 MPa, 27.6 MPa, 28.3 MPa and 28.9 MPa, respectively, Thus, the chip shear strength of nearly 30 MPa is obtained with the heat treatment time of about 10 hour. While with the heat treatment time of around 1 hour, the solder joint strength remains the same as that in Comparative Example 1 mentioned also below. It has turned out that a largely increased solder joint strength was obtained with the heat treatment time of 1 hour or more.

In Example 4 (where the heat treatment temperature is 200° C.), when the heat treatment time for the solder layer 5 is 0.1, 1, 5 and 10 hours, the chip shear strength for the corresponding submount 1 is 27.6 MPa, 30.8 MPa, 34.1 MPa and 37.6 MPa, respectively. Thus, the chip shear strength of 30 MPa or more is obtained with a heat treatment time of about 1 hour or more. While with the heat treatment of around 0.1 hour, the solder joint strength remains the same as that in Comparative Example 1 mentioned also below. It has turned out that a largely increased solder joint strength is obtained with the heat treatment time of 1 hour or more.

In Comparative Example 1, the solder layer 5 was not heat-treated at all but only left to stand as it was. When the standing time is varied from 0.1 hour to 10 hours, the chip shear strength remained to be 27.7 MPa, and thus, it turns out that when the solder layer 5 is not heat-treated, there is no improvement in chip shear strength.

In Comparative Example 2 (where the heat treatment temperature is 150° C.), when the heat treatment time for the solder layer 5 is 0.1, 1, 5 and 10 hours, the chip shear strength for the corresponding submount is 27.8 MPa, 27.5 MPa, 27.9 MPa and 27.9 MPa, respectively. These values are like those in Comparative Example 1 where no heat treatment is performed. It turns out that there is no improvement in chip shear strength when the heat treatment temperature is as low as 150° C.

In Comparative Example 3 (where the heat treatment temperature is 280° C.), when the heat treatment time for the solder layer 5 is 0.1, 1, 5 and 10 hours, the chip shear strength for the corresponding submount 1 is 27.3 MPa, 22.7 MPa, 15.6 MPa and 10.5 MPa, respectively. In this case, it is seen that when the heat treatment time is 0.1 hour, the initial solder joint strength is not different from that in Comparative Example 1 either. When it is 1 hour or more, the initial solder joint strength drops largely on the contrary.

From these results it has been found that in order to obtain an initial solder joint strength as high as, e.g., 30 MPa or more, the solder layer 5 should be heat-treated, as submounts 1 of Examples 1 to 4, at a temperature higher than 150° C. in a temperature range lower than the eutectic temperature of the solder layer 5 for a time period of 1 hour or more. Moreover, since this heat treatment was processed before the device 7 is mounted, the device 7 is not suffered by the thermal effect. Therefore, it follows that the yield of submounts 1 having devices 7 mounted thereon is further improved.

Results of measuring the thermal resistance of the submounts 1 and the emission output powers of light emitting diodes 7 mounted on the submounts 1 in Examples 1 to 4 will be described.

An arbitrary number of submounts 1 from those prepared were extracted, and the light emitting diodes 7 were mounted thereon. The thermal resistance was measured by the method developed by Teknologue, Co. Ltd.

Figure 10:
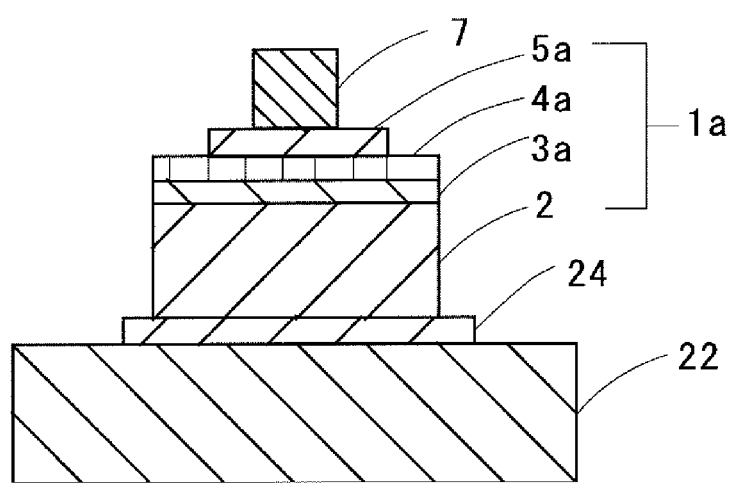
FIG. 10 is a cross sectional view diagrammatically illustrating how a submount having a light emitting diode mounted thereon is bonded on a stem.

FIG. 10 is a cross sectional view diagrammatically illustrating how a submount 1a having a light emitting diode 7 mounted thereon is bonded on a stem. As shown in FIG. 10, the submount 1a having the light emitting diode 7 solder-joined therewith is mounted on the stem 22 using a low temperature solder or Ag paste 24. The submount 1a is placed in a constant temperature chamber held at an arbitrary temperature $T_{ja1}$. In the Figure, the wiring to the light emitting diode 7 is omitted. The forward voltage $V_{fa1}$ of the light emitting diode 7 was measured at the constant current level of e.g., of 1 mA so that the heat generation of the light emitting diode 7 is negligible. Next, the constant temperature chamber is varied in temperature to $T_{ja2}$ which is then kept and the forward voltage $V_{fa2}$ of the light emitting diode is measured by flowing the constant current I. Varying the temperature of the constant temperature chamber to repeat the measurement gives rise to a relationship between the ambient temperature $T_j$ and forward voltage $V_f$ of the light emitting diode 7.

Figure 11:
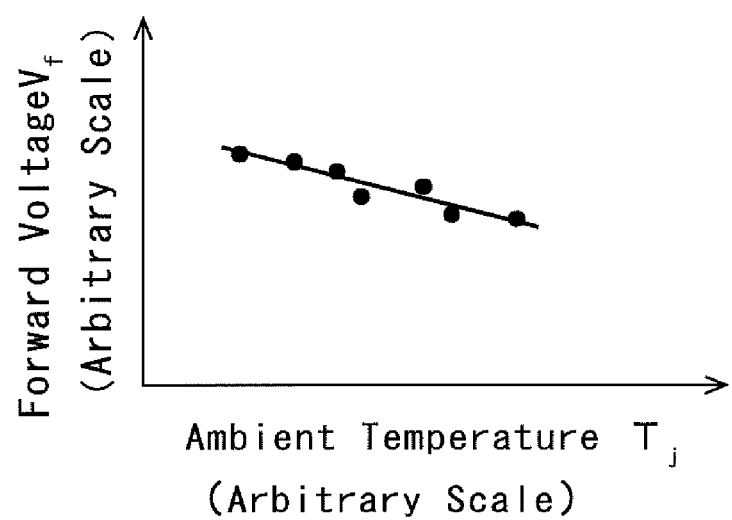
FIG. 11 is a graph illustrating a relationship between ambient temperature $T_j$ and forward voltage $V_f$ of a light emitting diode.

FIG. 11 is a graph showing the relationship between the ambient temperature $T_j$ and forward voltage $V_f$ of the light emitting diode 7 thus obtained from the measurement. In the graph, the ordinate axis represents the forward voltage $V_f$ (in an arbitrary scale) of the light emitting diode 7 and the abscissa axis represents its ambient temperature $T_j$ (in an arbitrary scale). From the graph shown in FIG. 11, the forward voltage of the light emitting diode 7 can be expressed by the equation (3) below through linear approximation.

$$V_f = (\Delta V_f / \Delta T_j) \times T_j + V_{f0} \quad (3)$$

where $V_{f0}$ is a constant.

Thus, from the temperature characteristic of the forward voltage $V_f$ of the light emitting diode 7, its temperature dependence ($\Delta V_f / \Delta T_j$) can be obtained.

Next, the constant temperature chamber is returned to room temperature (25° C.) and the forward voltage of the light emitting diode 7 was measured by applying a DC constant current.

Figure 12:
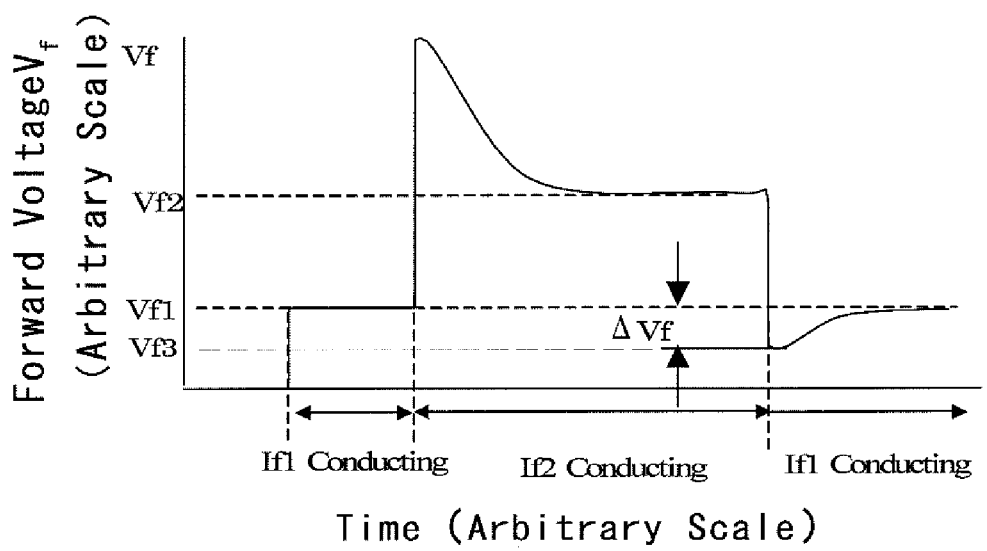
FIG. 12 is a graph illustrating a time chart when a pulsed current is flowing in a light emitting diode.

FIG. 12 is a graph illustrating a time chart when the DC constant current is flowing in the light emitting diode 7. In FIG. 12, the ordinate axis represents the forward voltage $V_f$ (in arbitrary scale) and the abscissa axis represents the time (in arbitrary scale). As shown in FIG. 12, DC constant currents $I_{f1}$, $I_{f2}$ and $I_{f1}$ are applied in this order to the light emitting diode 7 and forward voltages then developed thereacross are measured by an oscilloscope or others. When the current is altered from $I_{f1}$ to $I_{f2}$ and then from $I_{f2}$ to $I_{f1}$, transient voltages occur. Accordingly, as shown in the Figure, the conducting time of $I_{f2}$ is continued until stationary $V_{f2}$ is reached. The conducting time of $I_{f1}$ that $I_{f2}$ is returned to $I_{f1}$ is continued until stationary $V_{f1}$ is reached. As the current value is varied from $I_{f2}$ to $I_{f1}$, the measured voltage is $V_{f3}$ that is lower than the forward voltage of $V_{f1}$ when the initial current value of $I_{f1}$ and then it is settled to $V_{f2}$ value at a certain time lag. Let it be assumed that a difference of $V_{f1}$ from the lowest value $V_{f3}$ of forward voltage of the light emitting diode 7 is $\Delta V_f$.

$\Delta T_j$ is derived by the temperature dependence of $V_f$ of the light emitting diode 7 found beforehand ($\Delta V_f / \Delta T_j$). Here, the definition of thermal resistance is a temperature rise per unit power. Then, the thermal resistance R of the light emitting diode 7 can be found according to equation (4) below.

$$R = \Delta T_j / [(I_{f2} \cdot V_{f2}) - (I_{f1} \cdot V_{f1})] \quad (4)$$

Note that the thermal resistance is measured above using a digital multi-meter (made by Advantest Co., model R6240A) with current $I_{f1}$ as 1 mA and current $I_{f2}$ as 50 mA.

Next, the thermal resistance was measured without using the submount 1a. In this case, a light emitting diode 7 was directly mounted on a stem 22.

Figure 13:
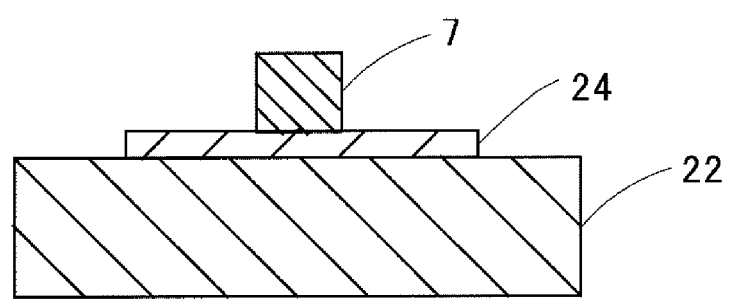
FIG. 13 is a cross sectional view diagrammatically illustrating that a light emitting diode is directly mounted on a stem without using a submount of the present invention.

FIG. 13 is a cross sectional view diagrammatically illustrating that the light emitting diode 7 is directly mounted on the stem 22 without using the submount 1a of the present invention. As shown in FIG. 13, the light emitting diode 7 was mounted directly on the stem 22 by means of a conductive paste 24 such as low temperature solder or Ag paste. The used stem 22 is identical to the submount 1a mounted thereon in the above thermal resistance measurement. Then, the thermal resistance was measured identically to the above method. A difference between a thermal resistance gained when the light emitting diode 7 was directly mounted on the stem 22 and that gained when the light emitting diode 7 was mounted on the stem 22 via the submount 1a constitutes a thermal resistance of the submount 1a including the solder layer 5 according to the present invention.

Table 2 shows measurement results of thermal resistances of the submounts 1 in Examples 1 to 4 and Comparative Examples 1 to 3. It shows the submounts 1 in all of which the solder layers 5 were heat-treated for 10 hours. Additionally, it includes emission output powers of light emitting diodes.

Here, the emission output powers were measured using a digital multi-meter (made by Advantest Co., model TR6143) with a forward current of 150 mA and also using an integrating sphere (made by Optronics Co., Ltd., 4 inch integrating sphere 740-BC) and a power meter (made by Optronics Co., Ltd., 730A).

TABLE 2

| | Solder Composition | Heat Treatment. (° C.) (10 Hrs) | Chip Shear Strength (MPa) | Submount Thermal Resistance (K/W) | LED Output Power (mW) |
|---|---|---|---|---|---|
| Ex. 1 | $Au_{70}Sn_{30}$ | 220 | 39.3 | 0.18 | 6.64 |
| Ex. 2 | | 250 | 35.0 | 0.25 | 6.38 |
| Ex. 3 | | 180 | 28.9 | 0.31 | 6.22 |
| Ex. 4 | | 200 | 37.6 | 0.27 | 6.30 |
| C. E. 1 | | None | 27.7 | 0.37 | 5.93 |
| C. E. 2 | | 150 | 27.9 | 0.35 | 5.99 |
| C. E. 3 | | 280 | 10.5 | 0.43 | 5.76 |

As is apparent from Table 2, thermal resistances of submounts 1 in Examples 1 to 4 are 0.18 K/W, 0.25 K/W, 0.31 K/W and 0.27 K/W, respectively. On the other hand, thermal resistances of submounts 1 in Comparative Examples 1 to 3 are 0.37 K/W, 0.35 K/W and 0.43 K/W, respectively. From this, it is seen that thermal resistances of submounts 1 in which their solder layers 5 were heat-treated in a temperature range of 180° C. to 250° C. in accordance with the present invention are lower than and reduced to one half or less from those in Comparative Examples 1-3.

Emission output powers from light emitting diodes 7 mounted on submounts 1 in Examples 1 to 4 are 6.64 mW, 6.38 mW, 6.22 mW and 6.30 mW, respectively. On the other hand, emission output powers from light emitting diodes 7 mounted on submounts 1 in Comparative Examples 1 to 3 are 5.93 mW, 5.99 mW and 5.76 mW, respectively. From this, it is seen that output powers from light emitting diodes 7 mounted on submounts 1 in which their solder layers 5 were heat-treated in the temperature range of 180° C. to 250° C. in accordance with the present invention are increased over those in Comparative Examples 1 to 3.

From the results of the thermal resistance measurement above, it is seen that the thermal resistance has been lowered and the emission output power has been improved by increasing the heat treatment temperature for the solder layer 5 formed on the submount 1 from 150° C. to 280° C. as its melting point or less. Especially in the heat treatment at 200 to 250° C., the thermal resistance were limited to less than 0.35 K/W. Also, the emission output powers then from the light emitting diodes 7 became 6.3 mW or more, and were increased by about 0.4 mW or more and by 12% at the maximum over those in Comparative Example 1 without the heat treatment. It is thus apparent that the thermal resistance of the submount 1 can be reduced by half or less in accordance with the present invention, Thus, it shows an improvement in characteristic of the light emitting diode 7 in that the heat produced in the light emitting diode 7 can effectively be dissipated.

EXAMPLE 5

Submounts 1 of Example 5 in which their solder layers 5 were heat-treated were prepared in the same manner as in Example 1 except that for each of the submounts a Pt layer of 0.2 μm was interposed between the Au electrode layer 4 and the solder layer 5 and the heat treatment was processed at 220° C. and for 12 hours. After the tape peeling test, the light emitting diode 7 was attached at 300° C. to the solder layer 5 of each of those submounts 1 which exhibited no peeling failure.

COMPARATIVE EXAMPLE 4

Submounts of Comparative Example 4 were prepared in each of which the solder layer 5 was not heat-treated. The submounts otherwise identical to those in Example 5 had the tape peeling test. Thereafter, the light emitting diode 7 was attached at 300° C. to the solder layer of each of those submounts which exhibited no peeling failure.

COMPARATIVE EXAMPLE 5

Submounts of Comparative Example 5 were prepared in each of which a layer of 0.033 μm thickness composed of Au:Sn=5:1 in atomic composition and a layer of 0.117 μm thickness composed of Au: Sn=1:1 in atomic composition were deposited alternately 20 times to form a solder layer of 3 μm thickness which was not heat-treated. The submounts otherwise identical to those in Example 5 had the tape peeling test. Thereafter, the light emitting diode 7 was attached at 300° C. to the solder layer of each of those submounts which exhibited no peeling failure.

COMPARATIVE EXAMPLE 6

A layer of 0.92 μm thickness composed of Au:Sn=50:50 in atomic composition was deposited, and then a layer of 2.03 μm thickness composed solely of Sn was deposited so that to form a solder layer of 2.95 μm in total thickness. Thereafter, a solder protective layer of 0.05% m thickness composed solely of Au was formed. The total thickness of the solder layer and the solder protective layer had a thickness of 3 μm, and their atomic composition is of Au:Sn=20:80, i.e., their weight composition of 29.3:70.7. Thus, the submounts of Comparative Example 6 were prepared without heat treatment on the solder layer, and the submounts otherwise identical to those in Example 5 had the tape peeling test. Thereafter, the light emitting diode 7 was attached at 300° C. to the solder layer of each of those submounts 1 which exhibited no peeling failure.

Figure 14:
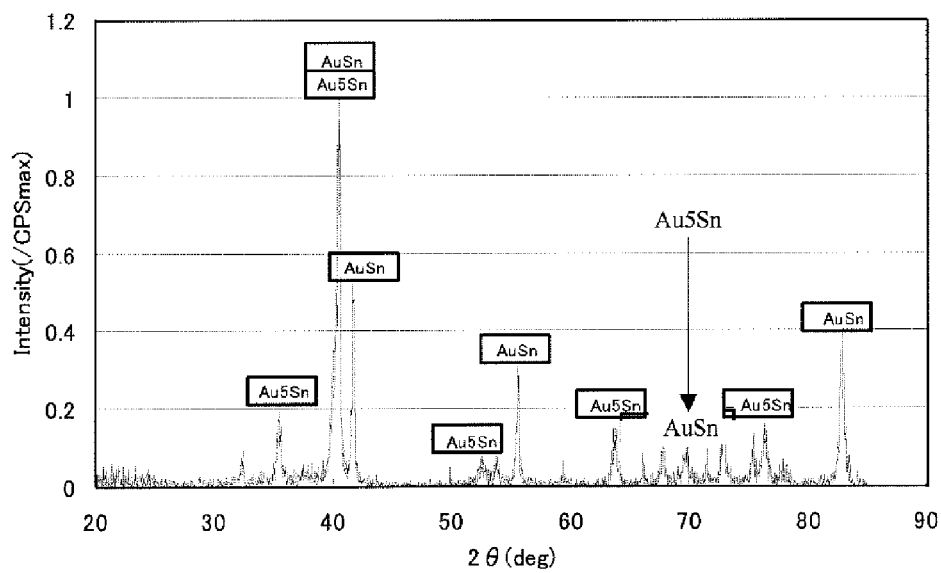
FIG. 14 includes X-ray diffraction profiles of solder layers in submounts of Comparative Example 4 and Example 5, illustrating: (A) that directly after film forming by vapor deposition of a solder layer in Comparative Example 4 and (B) that after heat treatment of a solder layer in Example 5.
Figure 14:
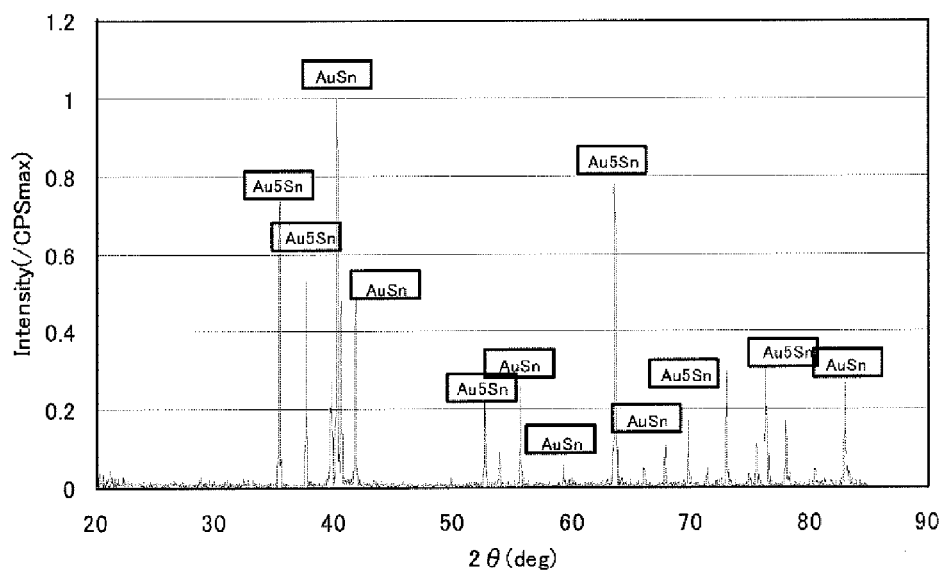

FIG. 14 includes X-ray diffraction profiles of solder layers in submounts of Comparative Example 4 and Example 5, illustrating: (A) that directly after film forming by vapor deposition of a solder layer in Comparative Example 4 and (B) that after heat treatment of a solder layer in Example 5. In FIG. 14, the ordinate axis represents the X-ray diffraction intensity (in an arbitrary scale) and the abscissa axis represents the angle (°), namely that corresponding to twice the angle of incidence θ of X-ray onto the atomic plane. The X-ray diffraction apparatus (made by Rigaku Denki, model RINT-2500) has a Cu X-ray source and an electron acceleration voltage of 30 kV. The surface of the solder layer 5 on which X-rays were diffracted was its device joining surface. As is apparent from FIGS. 14(A) and 14(B), it is seen that in Example 5 where the solder layer 5 was heat-treated, the diffraction intensity of $Au_5Sn$ phase is increased over that in Comparative Example 4 without the heat treatment.

Figure 15:
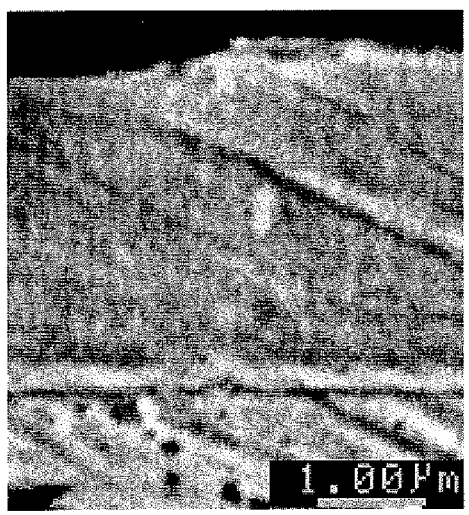
FIG. 15 is a scanning electron microscopic image showing a cross section of a solder layer prior to heat treatment in a submount of Example 5.

FIG. 15 is a scanning electron microscopic image showing a cross section of the solder layer prior to heat treatment in the submount of Example 5. The electron acceleration voltage was set at 15 kV and the measurement was made at a magnification of 10,000. As is obvious from FIG. 15, portions having granular segregations were observed in the solder layer 5 directly after vapor deposition of the solder layer 5. It is considered that each phase will be localized in a size of nanometer order. As is apparent from FIGS. 14(A) and 15, it has been confirmed that each of AuSn and $Au_5Sn$ phases directly after the vapor deposition are distributed in granular forms. In Comparative Example 4, too, the solder layer not heat-treated has a cross section similar to that of the solder layer 5 prior to heat treatment of a submount in Example 5 as mentioned above.

Figure 16:
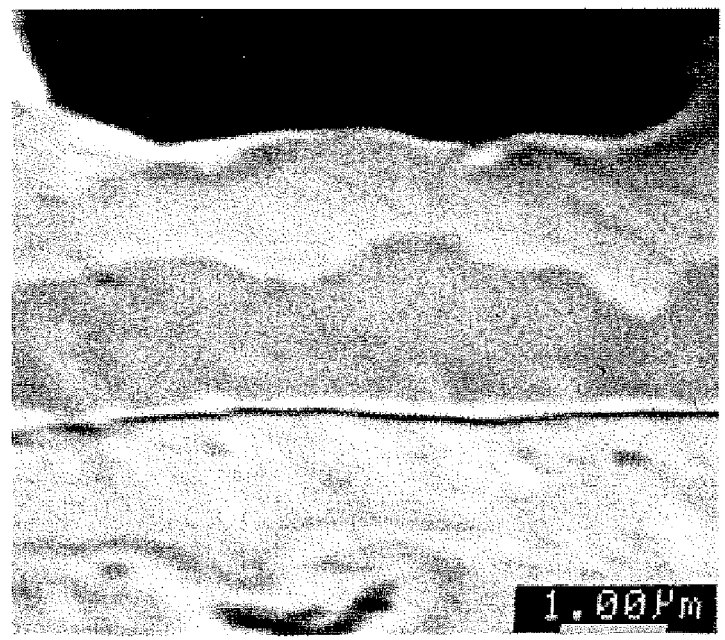
FIG. 16 is a scanning electron microscopic image showing a cross section of a solder layer subsequent to heat treatment in a submount of Example 5.

FIG. 16 is a scanning electron microscopic image showing a cross section of the solder layer subsequent to heat treatment in the submount 1 of Example 5. As mentioned above, the electron acceleration voltage was set to 15 kV and the measurement was made at a magnification of 10,000. As is apparent from FIG. 16, the solder layer 5 heat-treated at 220° C. for 12 hours was split into two layers. To correspond to the results of X-ray diffraction shown in FIG. 14(B), it is seen that its upper layer 5c constituting the device joining surface of the solder layer 5 is formed with $Au_5Sn$ phase in a lamellar form and the solder layer on the side of the base substrate 2, namely its lower layer 5d is formed with AuSn phase in a lamellar form.

Figure 17:
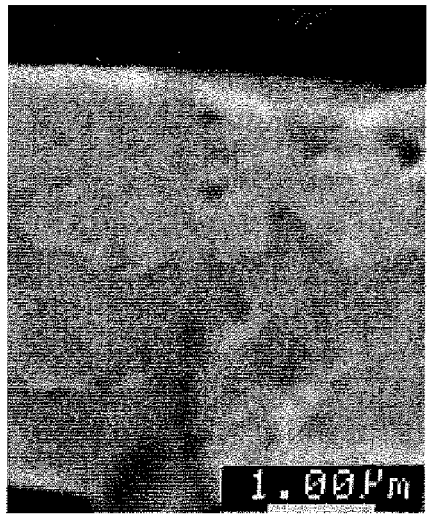
FIG. 17 is a scanning electron microscopic image showing a cross section of a solder layer solidified after it is melted at 300° C. subsequent to its heat treatment in a submount of Example 5.

FIG. 17 is a scanning electron microscopic image showing a cross section of the solder layer solidified after it was melted at 300° C. subsequent to its heat treatment in the submount of Example 5. As mentioned above, the electron acceleration voltage was set to 15 kV and the measurement was made at a magnification of 10,000. As is apparent from FIG. 17, in the cross section of the solder layer 5 melted at 300° C. and then solidified, it is seen that the solder layer 5 as after its heat treatment remained split by phase into two layers, indicating that the solder after it was melted remained stable.

Figure 18:
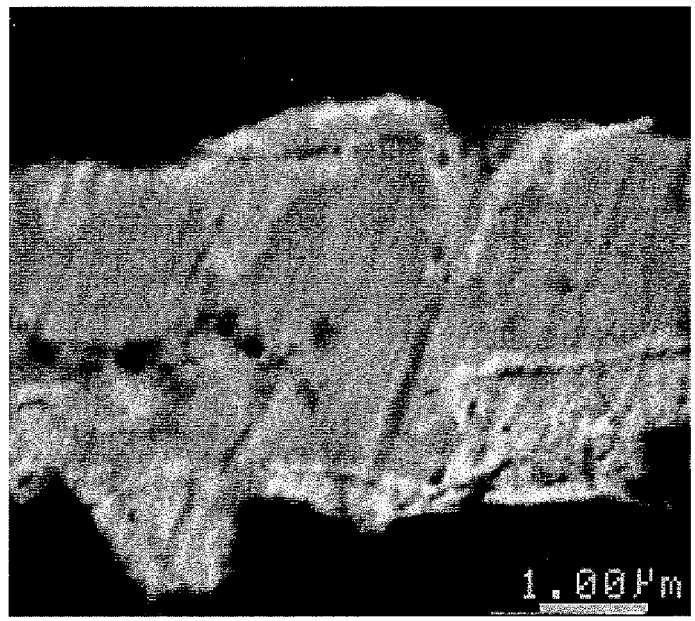
FIG. 18 is a scanning electron microscopic image showing a cross section of a solder layer solidified after it is melted at 300° C. in a submount of Comparative Example 4.

FIG. 18 is a scanning electron microscopic image showing a cross section of the solder layer solidified after it was melted at 300° C. in the submount of Comparative Example 4. In Comparative Example 4, the submount of which the solder layer had not been heat-treated was melted at 300° C. and then solidified. As mentioned above, the electron acceleration voltage was set at 15 kV and the measurement was made at a magnification of 10,000. As is apparent from FIG. 18, the two AuSn and $Au_5Sn$ phases are likewise found in the solder layer in the cross section of the solder layer not heat-treated which was melted at 300° C. and then solidified. It is seen that these two phases were not separated to distinct layers having each phases. It is also found that the AuSn phase lying in a lower part of the solder layer protrudes locally to its surface.

From the measurement results above in Example 5 and Comparative Example 4, as shown in FIGS. 14(A) and 15, it is seen in both cases that each of the AuSn and $Au_5Sn$ phases directly after the vapor deposition was distributed in the form of granules. As is apparent from FIGS. 17 and 18, it has been found that the heat-treated solder layer 5 in Example 5 was separated as layered structure even after it was melted and then solidified. Thus, it is seen that the upper layer 5c constituting the device joining surface of the solder layer 5 was melted.

Figure 19:
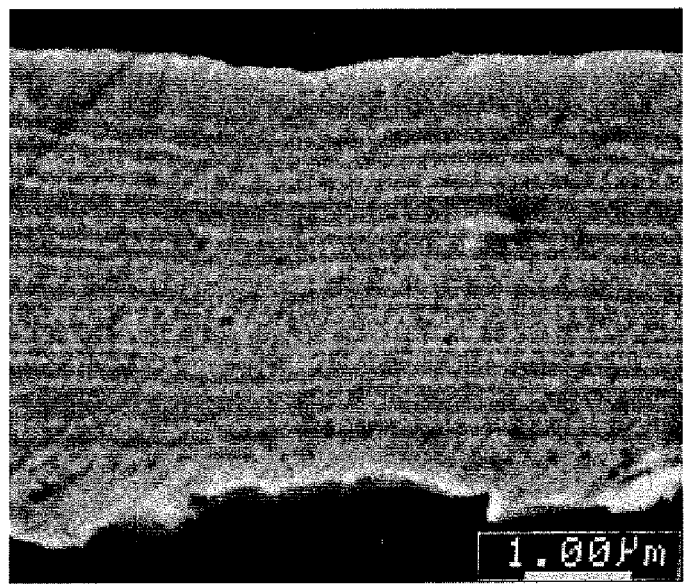
FIG. 19 is a scanning electron microscopic image showing a cross section of a solder layer deposited by vapor deposition in a submount of Comparative Example 5.
Figure 20:
FIG. 20 is a scanning electron microscopic image showing a cross section of a solder layer solidified after it is melted at 300° C. in a submount of Comparative Example 5.

FIG. 19 is a scanning electron microscopic image showing cross sections of the solder layer deposited by vapor deposition in the submount of Comparative Example 5. FIG. 20 is a scanning electron microscopic images showing a cross section of the solder layer solidified after it is melted at 300° C. in the submount of Comparative Example 5. As mentioned above, the electron acceleration voltage was set at 15 kV and the measurement was made at a magnification of 10,000. As is apparent from FIG. 19, in Comparative Example 5, the solder layer before it is melted has a structure that a layer of thick contrast and a layer of thin contrast were deposited alternately. As is apparent from FIG. 20, in Comparative Example 5 as in Example 5 and Comparative Example 4, two phases are found in the cross section of the solder layer melted at 300° C. and then solidified, and the AuSn phase is existed in its lower part. However, since there are thick contrast portions inside the upper $Au_5Sn$ phase, it is seen that the AuSn phase is interposed as the form of granules in the $Au_5Sn$ phase.

Figure 21:
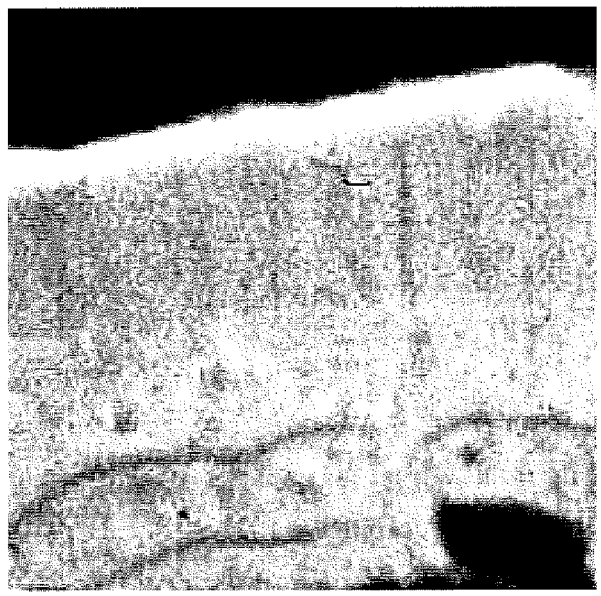
FIG. 21 is a scanning electron microscopic image showing a cross section of a solder layer deposited by vapor deposition in a submount of Comparative Example 6.
Figure 22:
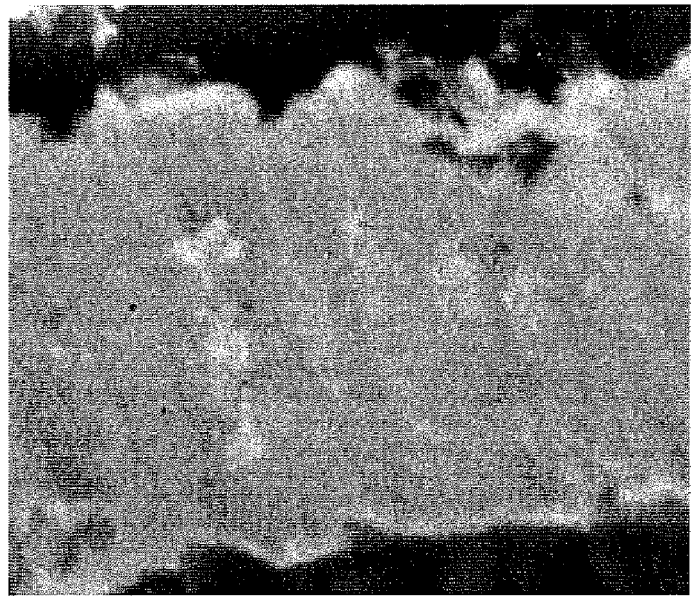
FIG. 22 is a scanning electron microscopic image showing a cross section of a solder layer solidified after it is melted at 300° C. in a submount of Comparative Example 6.

FIG. 21 is a scanning electron microscopic image showing a cross section of the solder layer deposited by vapor deposition in the submount of Comparative Example 6. FIG. 22 is a scanning electron microscopic image showing a cross section of the solder layer solidified after it is melted at 300° C. in the submount of Comparative Example 6. As mentioned above, the electron acceleration voltage was set to 15 kV and the measurement was made at a magnification of 10,000. As is apparent from FIG. 21, it is shown in Comparative Example 6 that although two layers were deposited in forming the solder layer, the solder layer was constructed by three-layer structure. In order to identify the phase of each layer, an EPMA composition analyzer (made by JEOL Ltd., model JXA-8200) was used to analyze chemical compositions at sections A, B, C and D in the Figure. Measurements were carried out under the conditions of an accelerating voltage of 20 kV, an emission current of 15 mA and a spot size of 0.5 μm diameter. As a result, it was found that A, B, C and D sections had AuSn, $AuSn_2$, Sn and Au phases, respectively.

As is apparent from FIG. 22, in Comparative Example 6, the cross section of the solder layer melted at 300° C. and then solidified has a thin contrast portion interposed in a large part of thick contrast portion unlike in Example 5 and Comparative Example 4. As a result of EPMA composition analysis performed as same manner in FIG. 21, it has confirmed that the portion of thick contrast and the portion of thin contrast consist of $AuSn_4$ and $AuSn_2$, respectively.

Next, the wettability of the solder layers 5 of the submounts of Example 5 and Comparative Examples 4, 5 and 6 were observed. Each of these submounts was raised in temperature in a nitrogen atmosphere and once held at 200° C. and then raised in temperature at a rate of rise in temperature of 5° C./second to 300° C. to melt the solder layer 5. The surface state of the solder layer 5 at 300° C. was taken a photograph. In this measurement, the high temperature observation apparatus (made by Sanyo Seiko, Co. Ltd., model NH-3SP-8000DS) was used.

Figure 23:
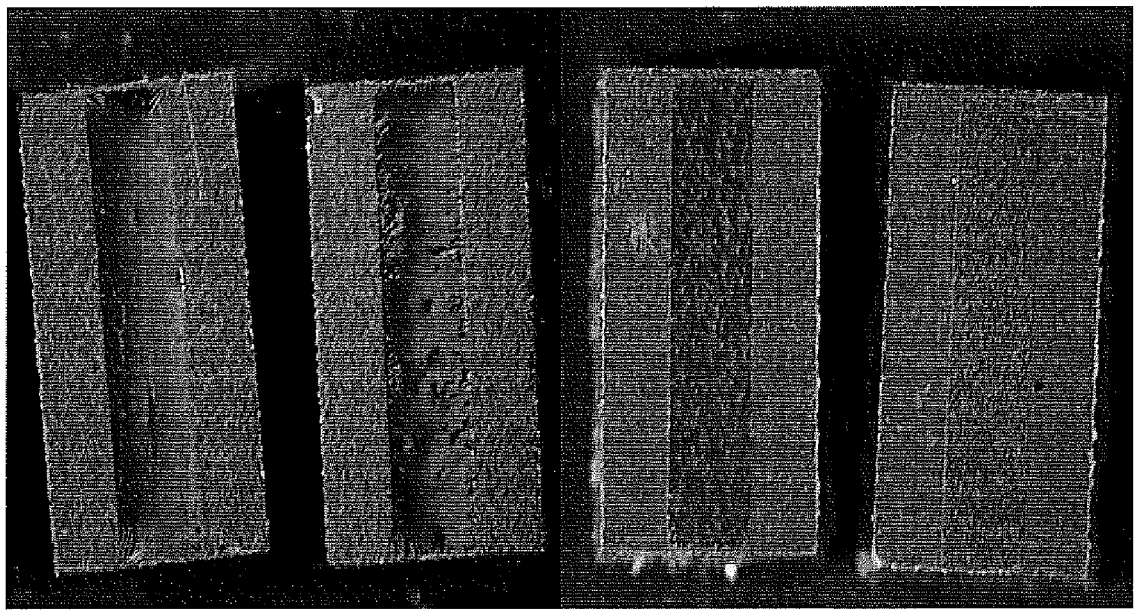
FIG. 23 shows a surface optical photographic image of solder layers at 300° C. in submounts of Example 5 and Comparative Examples 4, 5 and 6.

FIG. 23 shows a surface optical photographic image of the solder layers 5 at 300° C. in the submounts of Example 5 and Comparative Examples 4, 5 and 6. As is apparent from FIG. 23, it is seen in the submount of Example 5 that the solder layer 5 of its central part is evenly melted and the entire surface the solder layer 5 is uniformly wetted.

On the other hand, it is seen in the case of Comparative Example 4 that local irregularities having many concavo-convex are observed such as at its peripheral areas and the solder layer is not evenly wetted. In the case of Comparative Example 5, too, it is seen that the solder layer has irregulars having many concavo-convex over its whole surface and not uniformly wetted. The poor wettability, i.e., that irregular areas are formed in Comparative Examples 4 and 5 appears to be both due to an effect of AuSn interposed in the $Au_5An$ phase where they are molten. In the case of Comparative Example 6, since the solder layer is fine in solubility, but being irregular over its entire surface, it is seen that the solder layer had a poor wettability.

Figure 24:
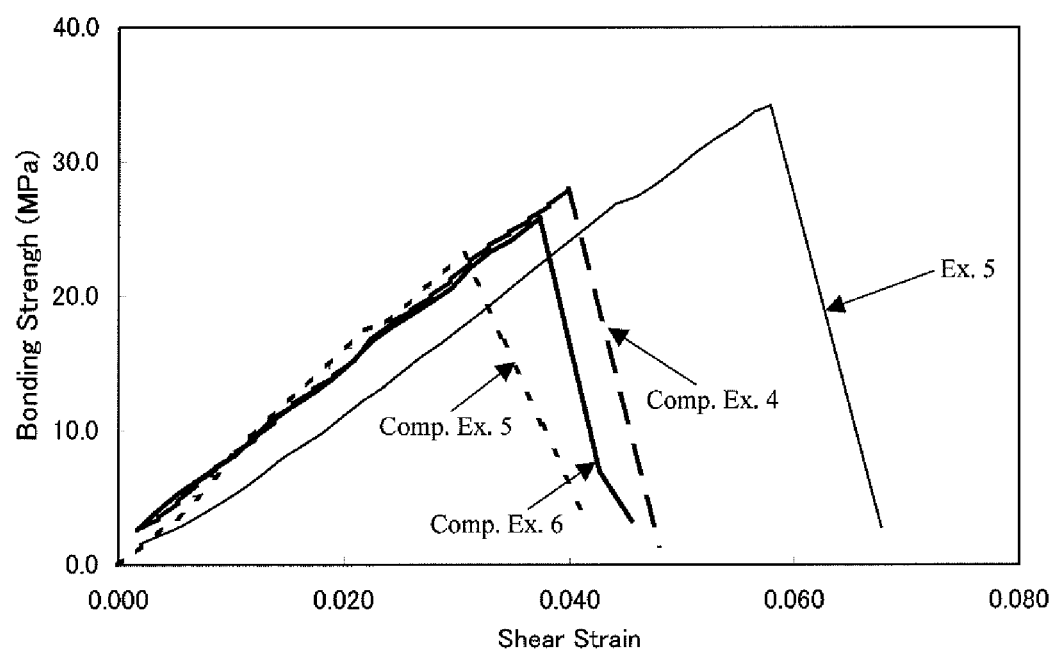
FIG. 24 is a diagram illustrating die-shear shearing test results of solder layers 5 in submounts of Example 5 and Comparative Examples 4, 5 and 6.

FIG. 24 is a diagram illustrating die-shear shearing test results of the solder layers 5 in submounts of Example 5 and Comparative Examples 4, 5 and 6. In FIG. 24, the ordinate axis represents the bonding strength (MPa) and the abscissa axis represents the shear strain. The shear plane has an area of 300 μm×300 μm and has a length of 300 μm in the shearing direction.

As is apparent from FIG. 24, the solder layers 5 in Example 5 and Comparative Examples 4, 5 and 6 have bonding strengths of 35 MPa, 28 MPa, 23 MPa and 26 MPa, respectively. It is obvious that the bonding strength of the solder layer 5 in the submount 1 of Example 5 is the highest.

Next, measurement results in a heat cycle test of the light emitting diode 7 mounted on each of the submounts in Example 5 and Comparative Examples 4, 5 and 6 will be described.

Each submount has an identical pattern to the above submount 1. The in-house product of the light emitting diode 7 was soldered to join to the submount 1 by using a die bonder (made by HiSOL, Inc., model MOA-1250α), at 300° C. under an applied load of 2.3 N. The rear side of the submount 1 was also solder-joined onto a TO-18 stem simultaneously. The heat cycle tester made by ETAC (model NT510) was used. The heat cycle test repeated a cycle conditioned as at 150° C. for 15 minutes and at −65° C. for 15 minutes. A current of 150 mA was flown continuously in the light emitting diode 7.

Figure 25:
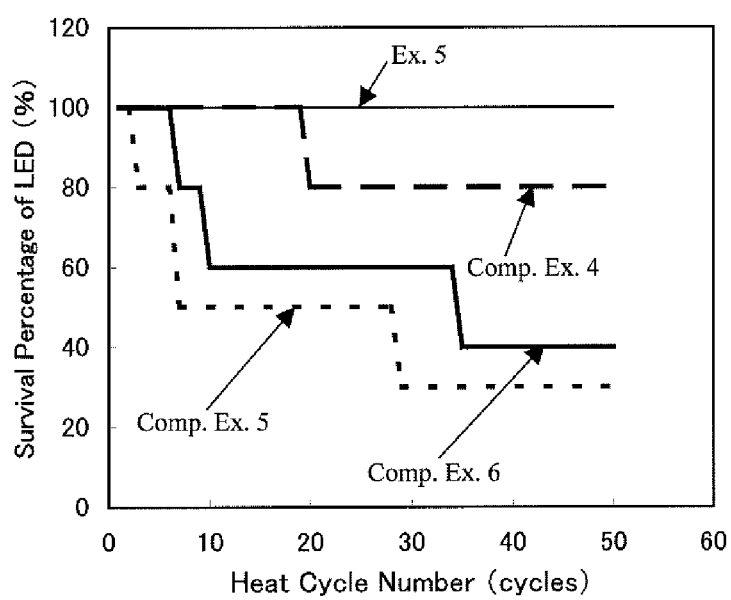
FIG. 25 is a graph illustrating survival percentages of light emitting diodes of Example 5 and Comparative Examples 4, 5 and 6 that underwent no conducting failure in heat cycle tests.

FIG. 25 is a graph illustrating survival percentages of light emitting diodes 7 of Example 5 and Comparative Examples 4, 5 and 6 that underwent no conducting failure in heat cycle tests. The ordinate axis represents the survival percentage of a light emitting diode and the abscissa axis represents the number of heat cycles. As is apparent from FIG. 25, the light emitting diodes 7 of Example 5 and Comparative Examples 4, 5 and 6 had survival percentages of 100%, 80%, 30% and 40%, respectively, after 50 cycles. It is obvious that the light emitting diode 7 of Example 5 had no failure and no conducting failure. On the other hand, the light emitting diodes 7 of Comparative Examples 4, 5 and 6 each had a conducting failure.

Figure 26:
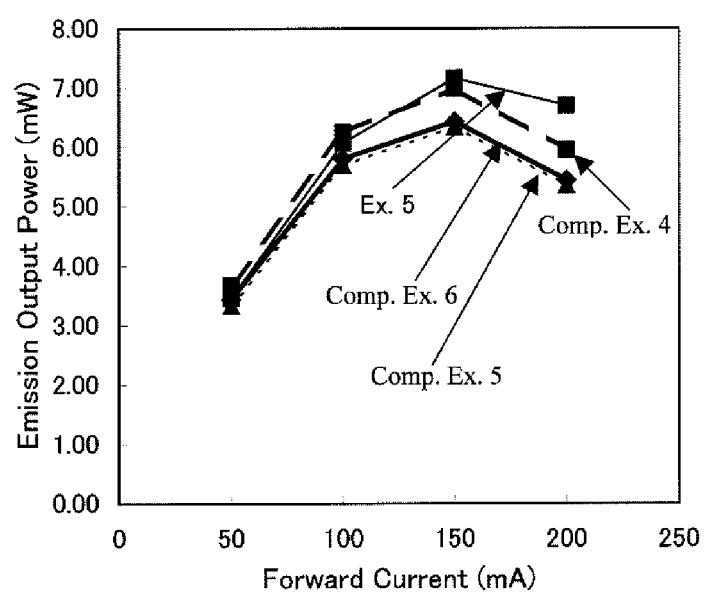
FIG. 26 is a graph illustrating forward current dependences of emission output power of light emitting diodes, prior to heat cycle tests, in Example 5 and Comparative Examples 4, 5 and 6.

FIG. 26 is a graph illustrating forward current dependences of emission output power of light emitting diodes 7, prior to heat cycle tests, in Example 5 and Comparative Examples 4, 5 and 6. In the graph of FIG. 26, the ordinate axis represents the emission output power (in mW) and the abscissa axis represents the forward current (in mA). As is apparent from FIG. 26, the light emitting diode 7 of Example 5 has its highest emission output power with forward current, especially with a conducting current of 150 mA or more. From this, it is seen that the solder layer 5 had the low thermal resistance before it was subjected to the heat cycle testing as well.

Of the light emitting diodes 7 subjected to the heat cycle testing, the light emitting diodes 7 which underwent no conducting failure after the heat cycle testing are mentioned of their emission characteristics before and after the heat cycle testing.

Figure 27:
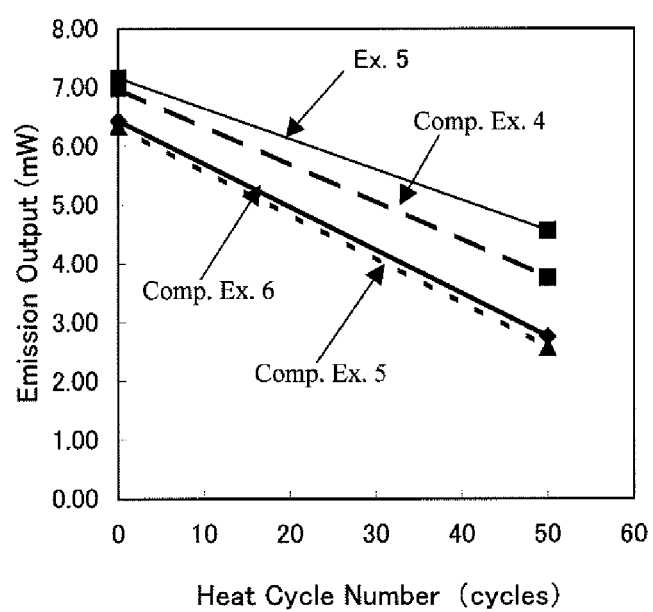
FIG. 27 is a graph illustrating heat cycle dependences of emission output power of light emitting diodes, in heat cycle tests, in Example 5 and Comparative Examples 4, 5 and 6.

FIG. 27 is a graph illustrating heat cycle dependences of emission output powers of light emitting diodes 7, in heat cycle tests, in Example 5 and Comparative Examples 4, 5 and 6. In the graph of FIG. 27, the ordinate axis represents the emission output power (in mW) and the abscissa axis represents the number of heat cycles. Note that the conducting current is 150 mA. As is apparent from FIG. 27, the emission output power of every light emitting diode 7 in Example 5 and Comparative Examples 4, 5 and 6 decreases as the number of heat cycles is increased. However, the emission output power in Example 5 is the most gentle in drop. From this, it is seen that the solder layer 5 in Example 5 has the low thermal resistance, reducing the heat cycle load imposed on the light emitting diode 7 and thus improving reliability of the light emitting diode 7.

A change in strength of solder joint between a solder layer 5 and a light emitting diode 7 before and after a heat cycle test of the light emitting diode 7 that underwent no conducting failure, among all the light emitting diodes 7 subjected to the heat cycle, will be described.

Figure 28:
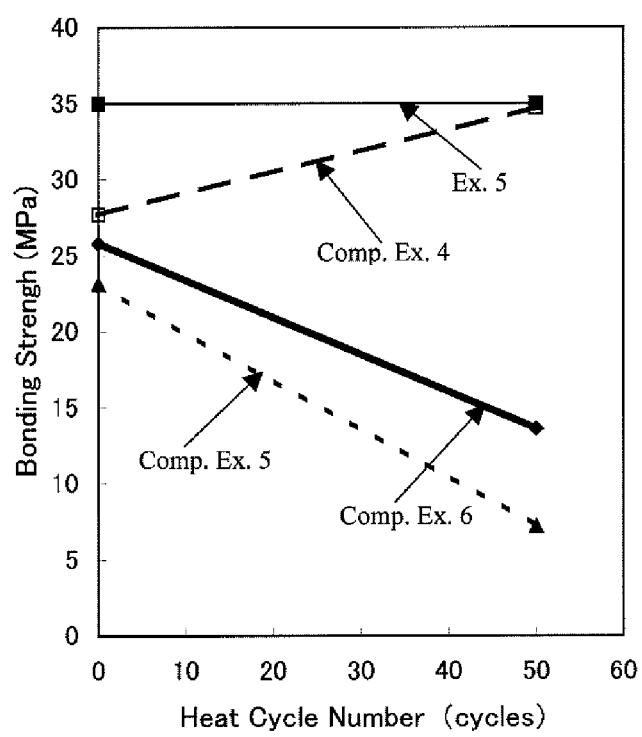
FIG. 28 is a graph illustrating heat cycle dependences of strength in solder bonding between light emitting diodes and solder layers in Example 5 and Comparative Examples 4, 5 and 6.
Figure 29:
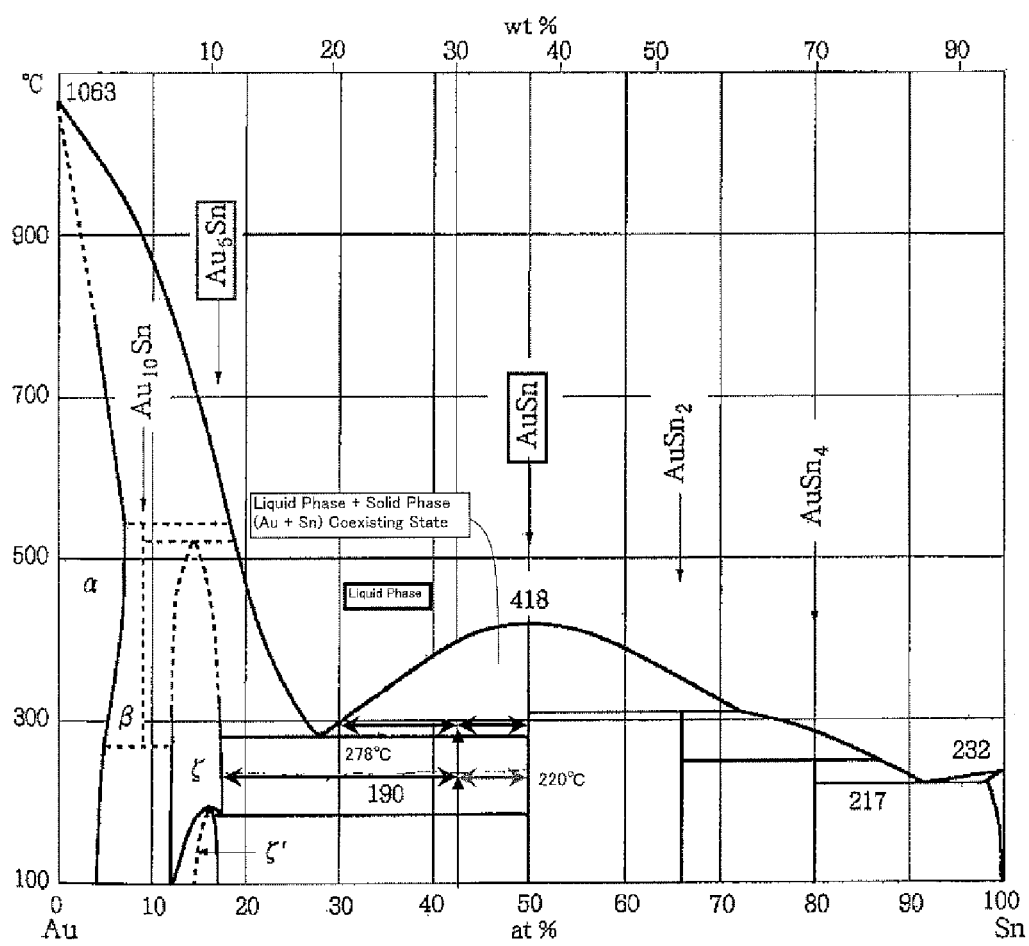
FIG. 29 is a phase diagram illustrating phase diagram by atomic percent of an alloy consisting of Au and Sn (Au—Sn alloy).

FIG. 28 is a graph illustrating heat cycle dependences of strength in solder joining between light emitting diodes 7 and solder layers 5 in Example 5 and Comparative Examples 4, 5 and 6. The ordinate axis represents the solder bonding strength (in MPa) and the abscissa axis represents the number of heat cycles.

As is apparent from FIG. 28, the solder bonding strengths before the heat cycle test and after the course of 50 heat cycles on Example 5 are 34.7 MPa and 35.1 MPa, respectively. It is obvious that the initial solder bonding strength is maintained.

On the other hand, the solder bonding strengths before the heat cycle test and after the course of 50 heat cycles on Comparative Example 4 are 27.7 MPa and 34.7 MPa, respectively. It is obvious that the initial solder bonding strength is lower than that on Example 5 and the solder bonding strength is not raised unless the heat cycle is imposed. On Comparative Example 5, the solder bonding strengths before the heat cycle test and after the course of 50 heat cycles are 23.1 MPa and 7.2 MPa, respectively. It is obvious that the initial solder bonding strength is lower than that in Comparative Example 4. Moreover, the solder bonding strength decreases with an increased rate as the number of heat cycles is increased, dropping to about 30% of the initial solder bonding strength after the course of 50 heat cycles. On Comparative Example 6, the solder bonding strengths before the heat cycle test and after the course of 50 heat cycles are 25.8 MPa and 13.6 MPa, respectively, It is obvious that the initial solder bonding strength is much lower than that in Comparative Example 4. Moreover, the solder bonding strength decreases with an increased rate as the number of heat cycles is increased, dropping to about 50% of the initial solder bonding strength after the course of 50 heat cycles.

Therefore, it has become clear that the light emitting diode 7 of Example 5 is high in the initial strength of solder joint with solder layer 5 and remains invariable if thermal cycles are imposed.

While forms of implementation in mounting the light emitting diode 7 as a device are described above, it should be noted that not limited to this, they can be applied to a device if the device is any semiconductor device having a rear face electrode or any circuit component and, needless to say, various modifications and variations thereof are possible and can be included within the scope of the invention defined by the appended claims. While in the forms of implementation described above the base substrate 2 is illustrated as composed of AlN as a ceramic material, it is not limited to this but can be composed of any alternative material. Further, an electrode layer 4, 13 and a solder layer 5, 14 may, in patterning, be suitably designed so as to constitute an aimed circuit configuration.

What is claimed is:

1. A method of manufacturing a device joining substrate having a base substrate and a lead free solder layer formed on the base substrate, comprising the steps of:

forming a lead-free solder layer of an Au—Sn alloy having a composition outside of its eutectic composition on the base substrate; and thereafter heat-treating the solder layer formed on the base substrate to split the solder layer into two layers in which an upper layer on a device joining face side is substantially in an $Au_5Sn$ phase, and a lower layer thereunder is substantially in an AuSn phase, said upper layer and said lower layer respectively having lamellar forms that exhibit substantially no granular segregations, wherein in said heat-treating step, a temperature of said substrate is higher than 150° C. but lower than 250° C. for no less than one hour.

2. The method of manufacturing a device joining substrate as set forth in claim 1, wherein the Au—Sn alloy has a composition of Au: Sn =70: 30 in weight percentages.

* * * * *